(12) United States Patent
Jennings

(10) Patent No.: US 11,874,792 B2
(45) Date of Patent: Jan. 16, 2024

(54) METHODS AND APPARATUS FOR PROVIDING A SERIALIZER AND DESERIALIZER (SERDES) BLOCK FACILITATING HIGH-SPEED DATA TRANSMISSIONS FOR A FIELD-PROGRAMMABLE GATE ARRAY (FPGA)

(71) Applicant: GOWIN Semiconductor Corporation, GuangZhou (CN)

(72) Inventor: Grant Thomas Jennings, Austin, TX (US)

(73) Assignee: Gowin Semiconductor Corporation, GuangZhou (CN)

( * ) Notice: Subject to any disclaimer, the term of this patent is extended or adjusted under 35 U.S.C. 154(b) by 0 days.

(21) Appl. No.: 17/968,646

(22) Filed: Oct. 18, 2022

(65) Prior Publication Data
US 2023/0038814 A1    Feb. 9, 2023

Related U.S. Application Data

(63) Continuation of application No. 17/318,841, filed on May 12, 2021, now Pat. No. 11,474,969.

(51) Int. Cl.
*G06F 13/42* (2006.01)
*G06F 1/08* (2006.01)
(Continued)

(52) U.S. Cl.
CPC ............ *G06F 13/4291* (2013.01); *G06F 1/08* (2013.01); *H03K 19/17744* (2013.01);
(Continued)

(58) Field of Classification Search
CPC .................. G06F 13/4291; G06F 1/08; G06F 2213/0042; H03K 19/17744; H03M 5/04; H03M 9/00
See application file for complete search history.

(56) References Cited

U.S. PATENT DOCUMENTS 7,570,724 B1 * 8/2009 Saha ...................... H04L 7/041
375/365
10,153,917 B1 * 12/2018 Tonietto ............... H04L 7/0331
(Continued)

OTHER PUBLICATIONS

Universal Serial Bus Specification, Revision 2.0, Apr. 27, 2000. (Year: 2000).*

*Primary Examiner* — Faisal M Zaman
(74) *Attorney, Agent, or Firm* — JW Law Group; James M. Wu

(57) ABSTRACT

A method for providing a high-speed data communication between a host and field-programmable gate array ("FPGA") is disclosed. The method, in one embodiment, is capable of identifying a data rate on a bus containing a P-channel and an N-channel operable to transmit signals in accordance with a high-speed Universal Serial Bus ("USB") protocol. Upon sampling, by a first input deserializer, first two samples of data signals carried by the P-channel in accordance with a first clock signals clocking twice as fast as the data rate of the P-channel, a second input deserializer is used to sample the second two samples of data signals transmitted by the N-channel in accordance with a second clock signal running twice as fast as the data rate of the N-channel with a ninety (90) degree phase shift. The method subsequently forwards the data signals to one or more configurable logic blocks ("LBs") in FPGA.

24 Claims, 15 Drawing Sheets

(51) Int. Cl.
*H03K 19/17736* (2020.01)
*H03M 9/00* (2006.01)
*H03M 5/04* (2006.01)

(52) U.S. Cl.
CPC ............... *H03M 5/04* (2013.01); *H03M 9/00* (2013.01); *G06F 2213/0042* (2013.01)

(56) References Cited

U.S. PATENT DOCUMENTS

| | | | |
|---|---|---|---|
| 10,599,603 B1* | 3/2020 | Agrawal | H03K 17/81 |
| 10,972,108 B1* | 4/2021 | Li | H03L 7/0812 |
| 2005/0034007 A1* | 2/2005 | Nemawarkar | G06F 1/10 |
| | | | 713/500 |
| 2007/0239900 A1* | 10/2007 | Beasley | G06F 13/4282 |
| | | | 710/2 |
| 2015/0193288 A1* | 7/2015 | Su | H04L 1/205 |
| | | | 714/704 |
| 2019/0260380 A1* | 8/2019 | Carlough | H03L 7/085 |
| 2020/0081857 A1* | 3/2020 | Barner | G06F 13/4009 |
| 2023/0134827 A1* | 5/2023 | Christensen | H04L 7/041 |
| | | | 375/365 |

* cited by examiner

METHODS AND APPARATUS FOR PROVIDING A SERIALIZER AND DESERIALIZER (SERDES) BLOCK FACILITATING HIGH-SPEED DATA TRANSMISSIONS FOR A FIELD-PROGRAMMABLE GATE ARRAY (FPGA)

PRIORITY

This patent application is a continuation patent application of a co-pending U.S. patent application having a U.S. patent application Ser. No. 17/318,841, filed on May 12, 2021 in the name of the same inventor and entitled "Methods and Apparatus for Providing A Serializer and Deserializer (Serdes) Block for Facilitating High-Speed Data Transmissions for A Field-Programmable Gate Array (FPGA)," issued into a U.S. patent with a U.S. Pat. No. 11,474,960, on Oct. 18, 2022, which is hereby incorporated herein by reference in its entirety.

RELATED APPLICATION

This application is related to the following co-pending application assigned to the Assignee of the present invention.

a. application Ser. No. 17/318,788, filed May 12, 2021, entitled "Methods and Apparatus for Providing A High-Speed Universal Serial Bus (USB) Interface for A Field-Programmable Gate Array (FPGA)" invented by the same inventors.

FIELD

The exemplary embodiment(s) of the present application relates to the field of programmable semiconductor devices for logic operations involving in the computer hardware and software. More specifically, the exemplary embodiment(s) of the present invention relates to connectivity between an FPGA and a host via a USB connection.

BACKGROUND

With increasing popularity of digital communication, artificial intelligence (AI), IoT (Internet of Things), and/or robotic controls, the demand for faster, flexible, and efficient hardware and/or semiconductors with processing capabilities is constantly in demand. To meet such demand, high-speed and flexible semiconductor chips are generally more desirable. One conventional approach to satisfy such demand is to use dedicated custom integrated circuits and/or application-specific integrated circuits ("ASICs"). A shortcoming with the ASIC approach is that it lacks flexibility while consumes a large number of resources.

An alternative approach, which enjoys the growing popularity, is utilizing programmable semiconductor devices ("PSDs") such as programmable logic devices ("PLDs") or field-programmable gate arrays ("FPGAs"). A feature of PSD is that it allows an end-user to program and/or reprogram one or more desirable functions to suit his/her applications after the PSD is fabricated.

A drawback, however, associated with a conventional FPGA or PLD is that it has limited capabilities relating to device connectivity. For example, although USB 1.0, 1.1 and 2.0 have the same or similar interfaces, they have different data rates, such as 1.5 megabits per second ("Mbps") as low-speed for USB 1.0, 12 Mbps as full speed for USB 1.1, and 480 Mbps as high-speed ("HS") for USB 2.0. Even though the low-speed and full speed can typically be handled by the GPIO (general purpose input output) of an FPGA, a large number of FPGA or PLD has a difficult time to handle the HS mode of USB 2.0. Another drawback is that unless an FPGA deploys a CDR (clock data recovery) circuit, a typical serializer and deserializer ("serdes") in FPGA or PLD has a difficult time to handle the HS mode of USB 2.0.

SUMMARY

Embodiments of the present application disclose a system that contains a host and a device wherein the device has a field-programmable gate array ("FPGA"). The system includes a set of configurable logic blocks ("LBs"), a bus, and a Universal Serial Bus ("USB") interface. The configurable LBs, in one aspect, are able to be selectively programmed to perform one or more logic functions. The bus contains a P-channel and an N-channel operable to transmit signals in accordance with a high-speed USB protocol. The USB interface is configured to include a first differential comparator operable to identify a logic zero state at the P-channel and a second differential comparator operable to identify a logic zero state at the N-channel.

Alternative embodiments include a method capable of providing a high-speed data communication between a host and FPGA. The method, in one embodiment, is capable of identifying a data rate on a bus containing a P-channel and an N-channel operable to transmit signals in accordance with a high-speed USB protocol. Upon sampling, by a first input deserializer, first two samples of data signals carried by the P-channel in accordance with a first clock signals clocking twice as fast as the data rate of the P-channel, a second input deserializer is used to sample the second two samples of data signals transmitted by the N-channel in accordance with a second clock signal running twice as fast as the data rate of the N-channel with a ninety (90) degree phase shift. The method subsequently forwards the data signals to one or more configurable LBs in FPGA.

Additional features and benefits of the exemplary embodiment(s) of the present invention will become apparent from the detailed description, figures, and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
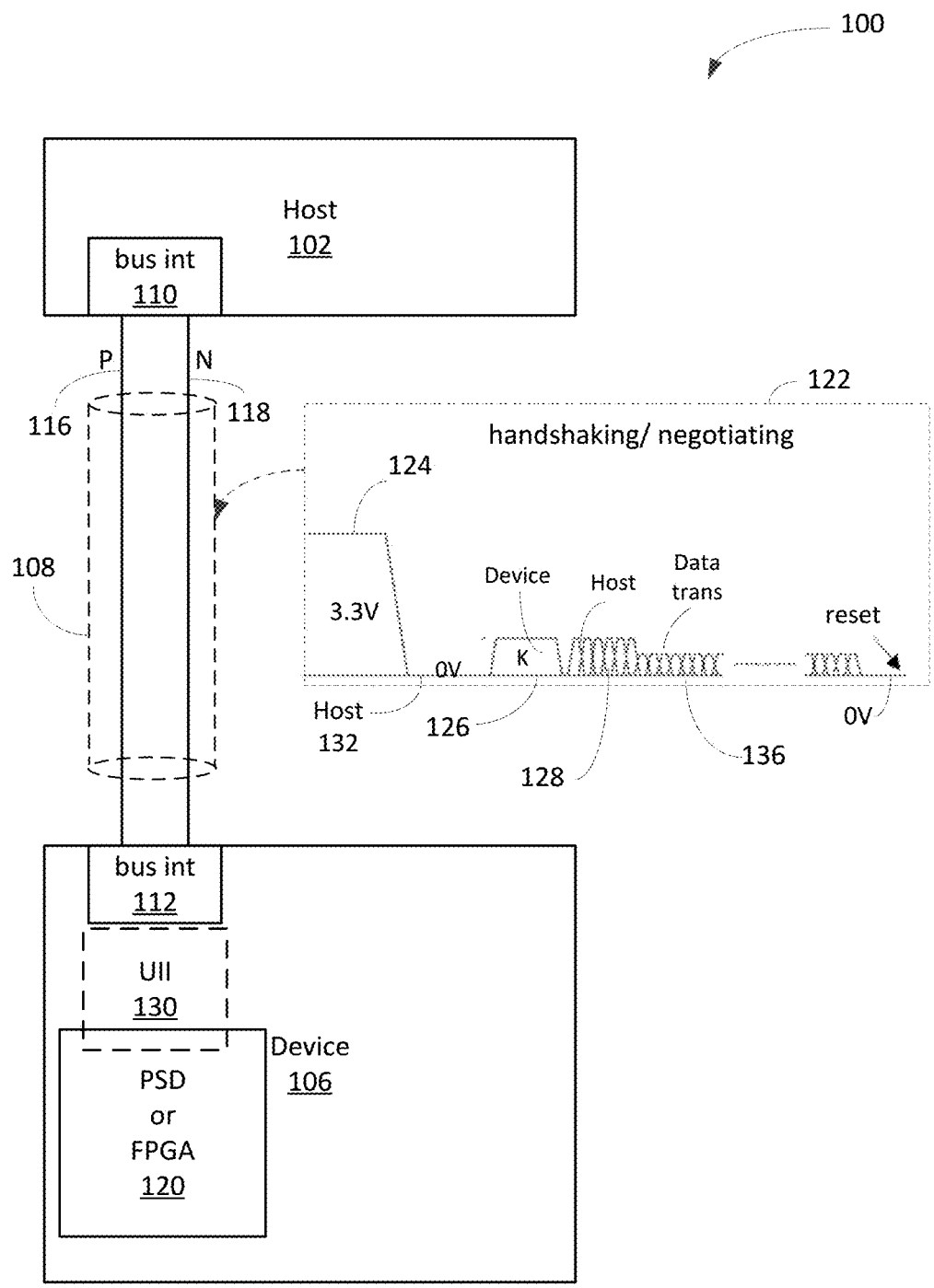
FIG. 1 is a block diagram illustrating a system layout containing a host and a device connected by a bus for facilitating a high-speed ("HS") data transmission in accordance with one embodiment of the present invention.

Embodiments of the present invention disclose a method(s) and/or apparatus for providing a programmable semiconductor device ("PSD"), programmable integrated circuit ("PIC"), or FPGA configured to provide an HS data transmission via a bus.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

In accordance with the embodiment(s) of the present invention, the components, process steps, and/or data structures described herein may be implemented using various types of operating systems, computing platforms, computer programs, and/or general-purpose machines. In addition, those of ordinary skills in the art will recognize that devices of a less general-purpose nature, such as hardware devices, field-programmable gate arrays (FPGAs), application-specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device, such as but not limited to, magnetoresistive random access memory ("MRAM"), phase-change memory, or ferroelectric RAM ("FeRAM"), flash memory, ROM (Read Only Memory), PROM (Programmable Read-Only Memory), EEPROM (Electrically Erasable Programmable Read-Only Memory), Jump Drive, magnetic storage medium (e.g., tape, magnetic disk drive, and the like), optical storage medium (e.g., CD-ROM, DVD-ROM, paper card and paper tape, and the like) and other known types of program memory.

The term "system" or "device" is used generically herein to describe any number of components, elements, subsystems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

Embodiments of the present application disclose a system that contains a host and a device wherein the device has an FPGA. The device includes a set of configurable LBs, a bus, and a USB interface. The configurable LBs, in one aspect, are able to be selectively programmed to perform one or more logic functions. The bus contains a P-channel and an N-channel operable to transmit signals in accordance with an HS USB protocol. The USB interface is configured to include a first receiver having a first differential comparator operable to identify a logic zero state at the P-channel and a second receiver having a second differential comparator operable to identify a logic zero state at the N-channel.

Alternative embodiments include an interface method capable of facilitating an HS data communication between a host and FPGA. For example, the method is capable of identifying a data rate on a bus containing a P-channel and an N-channel operable to transmit signals in accordance with an HS USB protocol. Upon oversampling the first two samples of data signals carried by the P-channel in accordance with a first clock which generates clock cycles twice the speed as the data rate of the P-channel, a second input deserializer is used to oversample the second two samples of data signals transmitted by the N-channel in accordance with a second clock running twice the data rate as the data rate at the N-channel with a ninety (90) degree phase shift. The processed data is subsequently forwarded to one or more configurable LBs of FPGA.

FIG. 1 is a block diagram 100 illustrating a system layout containing a host and a device connected by a bus for facilitating an HS data transmission in accordance with one embodiment of the present invention. Diagram 100 includes a host 102, a bus 108, and a device 106. Host 102, for example, can be a computer, a server, a smartphone, a vehicle, an airplane, and/or a supercomputer. A function of host 102 is to process data based on a set of instructions. In one aspect, host 102 includes a bus interface 110 used to communicate with external devices such as device 106 via a bus such as bus 108. A function of bus interface 110, in one example, is to facilitate HS data transmission between host 102 and device 106. It should be noted that the underlying concept of the exemplary embodiment(s) of the present invention would not change if one or more blocks (circuit or elements) were added to or removed from diagram 100.

Device 106 includes a programmable semiconductor device ("PSD") or FPGA 120, a bus interface 112, and a USB IO interface ("UII") 130. Bus interface 112 is used to connect to a bus such as bus 108 for facilitating data or control signals transmission. In one aspect, bus interfaces 110-112 are physical USB connectors capable of receiving a USB 2.0 connector. PSD or FPGA 120 provides user-defined or user configurable logic operations. It should be noted that PSD 120, also known as FPGA, programmable integrated circuit ("PIC"), or Programmable Logic Device ("PLD"), includes clock and I/O fabric capable of facilitating HS data transmission. It should be noted that the terms "FPGA", "PLD", PSD, and PIC can be used interchangeably. UII 130 is used to interface between host 102 and device 106 using bus 108. In one aspect, UII 130 is configured to employ a portion of FPGA IO blocks to perform IO interface function relating to USB 2.0 protocol.

Bus 108, in one example, is a USB 2.0 cable containing P-channel 116 and N-channel 118. Bus 108, in one aspect, is a serialized bus and/or differential wire-pair bus that contains additional wires such as wires for power supply. Note that P-channel 116 and N-channel 118 can also be referred to as D+ and D−. To simplifying forgoing discussion, only two wires, namely, P-channel and N-channel are described. The data rate for USB 2.0 is an HS data rate running at 480 Mbps. It should be noted that to achieve a link or cable having an HS data rate, each end of P-channel 116 and N-channel may be required to be terminated with a 45 Ohm resistance to ground. In an alternative embodiment, bus 108 can be other types of bus connections, such as, but not limited to, USB 3.0, USB 3.1, USB-C, Thunderbolt, HDMI (High-definition Media Interface), display port, and so forth.

Since clock signals between host 102 and device 106 are operating independently, a handshaking or negotiation process 122 may be required for limited synchronization to set basic communication rules. For example, after monitoring idling voltage at 124 with 3.3 volts ("V"), host 102 drives zero (0) V on P-channel 116 as indicated by numeral 132. Upon detecting 0V on P-channel 116, device 106 sends a low voltage 126 on P-channel 116 to indicate that device 106 is able to handle HS data rate such as 480 Mbps. After detecting low voltage 126, host 102 issues a sequence of transmission signals via P-channel 116 to begin an initialization process as indicated by numeral 128. Once sequence of transmission 128 is detected, device 106 and host 102 begin to transmit information 136 via lower voltage. It should be noted that the HS data rate may be reset at the end of each data transmission.

A system or system layout containing a host 102, a USB 2.0 bus 108, and a device 106. Host 102 including a USB 2.0 IO connection or interface 110 is able to perform and/or process digital data. USB 2.0 bus 108, in one example, is used to connect Host 102 to device 106. USB 2.0 bus 108 includes P-channel 116 and N-channel 118 operable to facilitate HS data transmission.

Device 106 includes FPGA 120 configured to include configurable LBs, a first differential comparator, and a second differential comparator. While the first differential comparator is operable as a receiver to identify a logic zero state at P-channel 116, the second differential comparator is operable to identify a logic zero state at N-channel 118. The configurable LBs can be selectively programmed to perform one or more user defined logic functions. FPGA or PLD 120, in one aspect, further includes a pull-up resister, a bidirectional differential transceiver, and two low voltage complementary metal oxide semiconductor ("LVCMOS") circuits as receivers, not shown FIG. 1. It should be noted that LVCMOS includes, but not limited to, low voltage complementary metal oxide semiconductor 25 ("LVCMOS25") circuits, low voltage complementary metal oxide semiconductor 33 ("LVCMOS33") circuits, and the like. The pull-up resister, which is coupled to an LVCMOS circuit such as an LVCMOS33 circuit, is used to pull-up P-channel 116 to a logic one (1) state. The bidirectional differential transceiver can transmit and/or receive information to and from host 102 via P-channel 116 and/or N-channel 118. A first LVCMOS circuit, in one embodiment, is capable of driving high impedance at P-channel 116. A second LVCMOS can be used to drive high impedance at N-channel 118.

An advantage of using UII 130 is that it facilitates HS data transmission with clock cycle of 480 Mbps between a host and an FPGA.

IO Interfacing Between Host and Device

Figure 2:
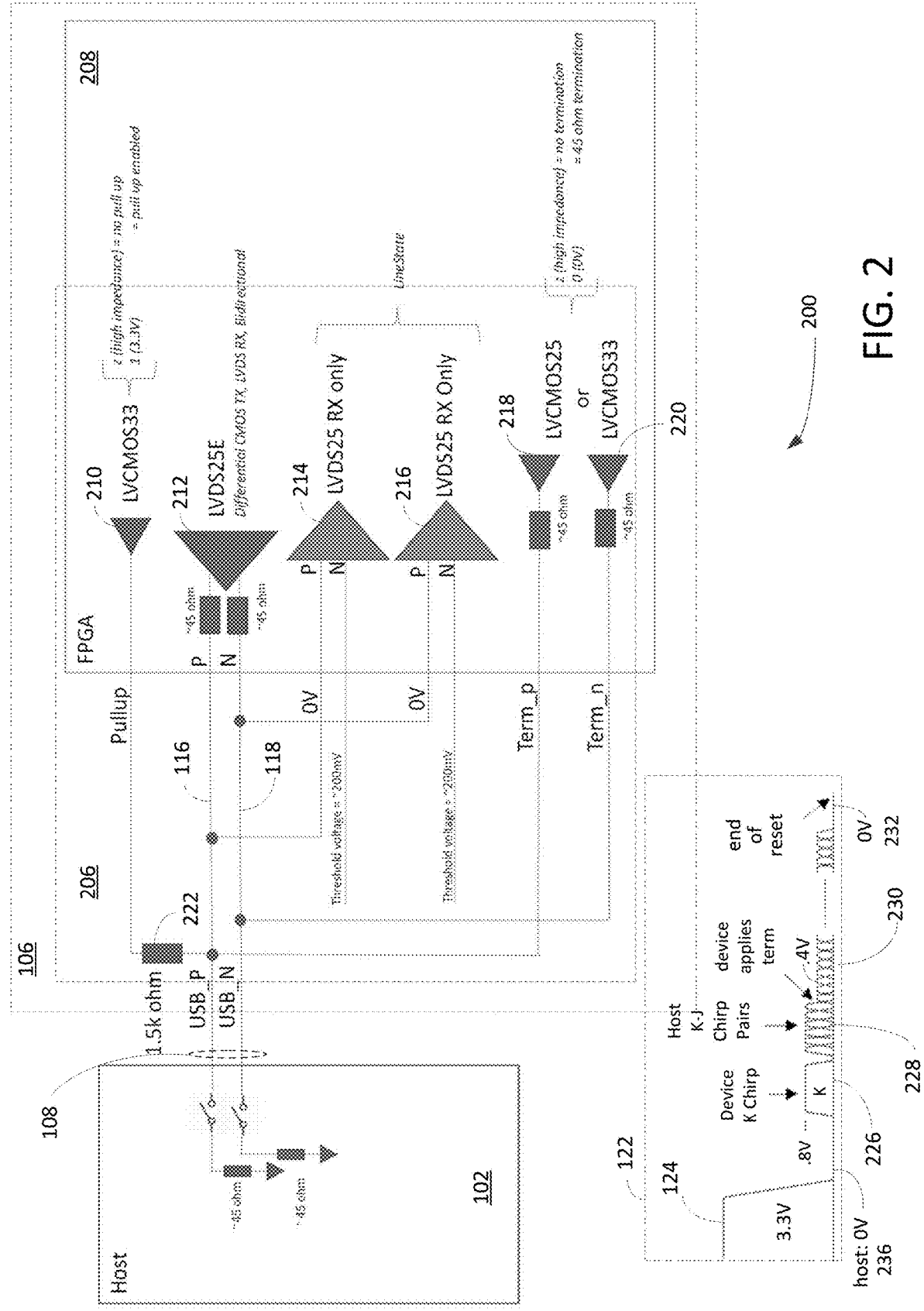
FIG. 2 is a block diagram illustrating a more detailed 10 interface for facilitating HS data transmission between a host and PSD device in accordance with one embodiment of the present invention.

FIG. 2 is a block diagram 200 illustrating an IO interface for facilitating HS data transmission between a host and PSD device in accordance with one embodiment of the present invention. Diagram 200 includes host 102, device 106, and bus 108 wherein device 106 includes UII 206 and FPGA 208. UII 206, in one embodiment, uses a portion of circuitry and/or IO elements existed in FPGA 208. Host 102 and device 106 are connected by bus 108 which contains a P-channel 116 and a N-channel 118. It should be noted that the underlying concept of the exemplary embodiment(s) of the present invention would not change if one or more blocks (circuit or elements) were added to or removed from diagram 200.

UII 206, in one embodiment, includes a pull-up resistor 222, LVCMOS circuit 210, low voltage differential signaling ("LVDS") transmitter 212, first LVDS receiver 214, second LVDS receiver 216, two LVCMOS circuits 218-220. It should be noted that some of IO circuits such as LVCMOS circuit 210, LVDS 212, and receivers 214-216 are part of FPGA IO block. For an exemplary embodiment, pull-up resistor 222 is a 1.5 ohm and LVCMOS circuit 210 is an LVCMOS33 circuit. While LVDS transmitter 212 is a low voltage differential signaling 2.5V ("LVDS25E") transmitter, LVDS receivers 214-216 can be LVDS25 receivers. LVCMOS circuits 218-220, in one example, are LVCMOS25 circuits.

LVDS*E is a differential driver wherein * refers to as the voltage level. For example, LVDS25E indicates that the LVDS*E uses 2.5 volts. Similarly, LVCMOS33 circuit 210 indicates that LVCMOS uses 3.3 volts. While an LVDS25 receiver refers to an LVDS receiver uses 2.5 volts, an LVCMOS33 circuit refers to LVCMOS uses 3.3 volts. It should be noted that LVDS*E is using LVCMOS IO as a differential pair. It should be noted that some of IO circuits such as LVCMOS33 circuit 210, LVDS25E 212, and receivers 214-216 are part of FPGA IO block. A function of UII 206 is to establish a handshaking or negotiation process between host 102 and FPGA 208 before HS data transmission via USB 2.0 bus 108. Another function of UII 206 is to provide oversampling data signals during HS data transmission between host 102 and FPGA 208.

Embodiments of the presently claimed invention disclose a process of providing an IO interface between host 102 and FPGA 208 via USB 2.0 bus 108. USB 2.0 bus 108 is a USB cable capable of transmitting data using USB 1.0, USB 1.1, and USB 2.0 protocols with the same or substantially the same pin layout. A USB cable, in one example, is able to facilitate data transmission using a low-speed as USB 1.0 protocol, full-speed as USB 1.1 protocol, and HS as USB 2.0 protocol. While the low-speed and full-speed have bandwidth of 1.5 Mbps and 12 Mbps respectively, the HS has a data rate of 480 Mbps.

To transmit data via an HS having a data rate of 480 Mbps, the data signals need to be transmitted via a USB cable which is originally designed for 1.5 or 12 Mbps data rate. It should be noted that when a link or cable conveys HS data rate, each end of P-channel (also known as D+ line) and N-channel (also known as D− line) are terminated with a 45 Ohm resistance to ground. Data is transmitted through steering a current of 17.78 mA (milliampere) resulting in a voltage of 400 mV (millivolt) at the channel. Note that a differential state of channel or link may be detected by a differential receiver.

Diagram 200 includes a handshake or negotiation process 122 to initialize USB 2.0 HS mode between host 102 and device 106. It should be noted that process 122 starts out in a full-speed mode having a voltage swing of 3.3V as indicated by numeral 124. Device 106 provides a 1.5K pull up on P channel 116 of a differential IO pair to indicate to host 102 that it should use full-speed mode instead of low-speed mode. Note that host 102 uses 45 ohm resistors to terminate P and N channels 116-118 and ground. Upon seeing the SE0 condition which indicates that both P and N channel 116-118 are at 0V as indicated by numeral 236, device 106 activates UII 206 to drive P and N channels 116-118 from 0V to 800 mV which is called a "K-chirp" as indicated by numeral 226. Upon detecting the K-chirp by host 102, host 102 acknowledges that device 106 is HS capable and issues a series of K-J chirp pairs as indicated by numeral 228. After seeing the K-J chirps, device 106 adds 45 ohm termination to P and N channel 116-118 to reduce the voltage. In one example, device 106 subsequently drives LVCMOS to high impedance which effectively removes pull-up resistor 222 from P channel 116. Once pull-up resistor 222 is removed, the voltage on the channel is further reduced to 400 mV as indicated by numeral 230. Host 102 and device 106 are now in HS mode. It should be noted that the IOs for the host and device are required to support the condition of differential IO pair.

Referring back to FIG. 2, diagram 200 shows an apparatus or system layout containing host 102, device 208, and a USB bus 108 wherein device is a programmable device capable of performing user configurable logic functions. Device 106 includes FPGA 208 and UII 206 wherein FPGA 208 contains multiple regions or arrays of configurable LBs. The configurable LBs are able to be selectively programmed to perform one or more user defined logic functions. In one aspect, a portion of the configurable LBs is assigned to UII 206 for providing at least a portion of USB IO functions. Alternatively, the configurable LBs are able to communicate with host 102 via bus 108 through UII 206. USB bus 108 includes P-channel 116 and N-channel 118 operable to transmit signals or data in accordance with an HS USB protocol.

UII 206, also known as USB interface, is configured to include a first differential comparator 214 and a second differential comparator 216. First differential comparator 214 is operable as a receiver to identify a logic zero state at P-channel 116. Second differential comparator 216 is operable to identify a logic zero state at N-channel 118. In one example, first differential comparator 214 is configured to generate a logic value in response to a logic state at P-channel 116 and a predefined threshold voltage. Second differential comparator 216 is configured to generate a logic value in response to a logic state at the N-channel and a predefined threshold voltage. In one aspect, the predefined threshold voltage is set to 200 mV. It should be noted a function of differential comparators 214-216 is to detect zero (0) volt on P-channel 116 and/or N-channel 118. Another function of differential comparators 214-216 is to function as receiver capable of obtaining signals from P-channel 116 as well as N-channel 118.

The USB interface or UII 206 also includes a pull-up resister 222 which is coupled or connected to LVCMOS circuit 210 for driving P-channel 116 to a logic one (1) state. UII 206, in one aspect, further includes an LVDS transmitter 212 configured to transmit information to an external device such as host 102 via P-channel 116 and/or N-channel 118. In one aspect, LVDS transmitter 212 may be replaced with a bidirectional LVDS transceiver capable of transmitting and receiving information.

UII 206, in one embodiment, further includes two LVCMOS circuits 218-220 wherein a first LVCMOS circuit 218 is coupled to P-channel 116 and configure to drive high impedance at P-channel 116. Second LVCMOS 220 is coupled to N-channel 118 and configure to drive high impedance at N-channel 118. While first LVCMOS circuit 218 may be used to drive a logic zero state at P-channel 116, second LVCMOS circuit 220 is used to drive a logic zero state at N-channel 118. Depending on the applications, first and second LVCMOS circuits 218-220 can also be replaced with LVCMOS circuits.

In operation of IO interface, host 102, in one example, drives both P-channel 116 and N-channel 118 to logic zero (0) state as indicated by numeral 236 after termination of full-speed mode as indicated by numeral 124. First differential comparator 214 receives a first signal from P-channel 116 and compares the received first signal with a predefined threshold voltage (i.e., 200 mV). If the first signal is lower than 200 mV, first differential comparator 214 issues a detection of zero (0) volt at P-channel 116. Similarly, second differential comparator 216 receives a second signal from N-channel 118 and compares the received second signal with a predefined threshold voltage (i.e., 200 mV). If the second signal is lower than 200 mV, second differential comparator 216 issues a detection of zero (0) volt at N-channel 118. Upon detection of zero (0) volts on both P-channel 116 and N-channel 118, UII 206 acknowledges that host 102 is HS data rate capable. To inform that device 106 is also HS data rate capable, UII 206 activates LVDS transmitter 212 to drive a K-Chirp 226 with 800 mV. Upon detecting K-Chirp 226 by host 102, host 102 sends a sequence of signals referring to K-J Chirp pairs 228 on P-channel 116. After removing resister 222 by driving high impedance via LVCMOS circuit 210, the voltage swing at P-channel 116 is further reduced to 400 mV. The HS data transmission between host 102 and device 106 is established as indicated by numeral 230. It should be noted that at end of each transmission, a reset 232 is generally required. It should be noted that the described voltage levels, resistance values, and/or current values are for the illustrative purposes. The underlying concept of the presently claimed embodiment(s) does not change if different voltages, resistances, and/or current are used.

An advantage of using UII 206 for IO interface between host 102 and FPGA 208 is that it facilitates FPGA 208 to operate at lower voltage at 200 mV (millivolts) with +/−200 mV differential swing. Another advantage of using UII 206 is that it is able to negotiate with the host to establish HS data transmission with a bandwidth of 480 Mbps.

Figure 3:
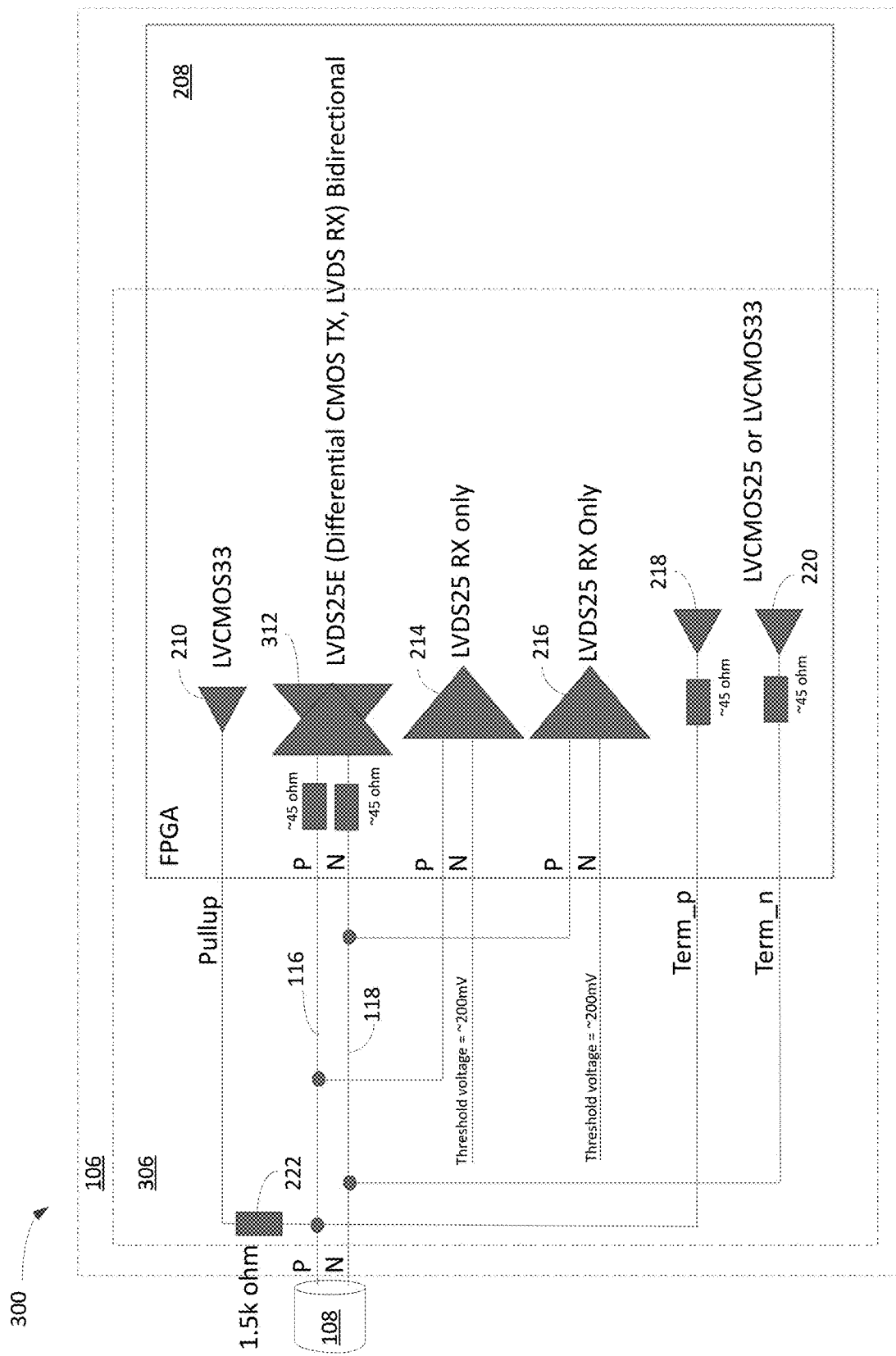
FIG. 3 is a block diagram illustrating an alternative embodiment of an IO interface block for facilitating an HS data transmission between a host and FPGA in accordance with one embodiment of the present invention.

FIG. 3 is a block diagram 300 illustrating an alternative embodiment of an IO interface block for facilitating HS data transmissions between a host and FPGA in accordance with one embodiment of the present invention. Diagram 300 includes a device 106 and an HS bus 108 wherein device 106 includes UII 306 and FPGA 208. UII 306, in one embodiment, uses at least a portion of FPGA IO components to establish and facilitate data transmission via the USB 2.0 protocol. It should be noted that the underlying concept of the exemplary embodiment(s) of the present invention would not change if one or more blocks (circuit or elements) were added to or removed from diagram 300.

UII 306 is similar to UII 206 shown in FIG. 2 except that LVDS transmitter 212 in FIG. 2 is replaced with an LVDS bidirectional transceiver 312. FPGA 208, in one example, includes multiple LVDS bidirectional transceivers for performing FPGA IO functions. In one embodiment, FPGA 208 designates a portion of its IO components, such as LVDS 312 and LVDS receivers 214-216 to UII 306 for performing HS data transmissions.

UII 306, in one example, addresses each of the line states such as P-channel 116 and N-channel 118 for negotiation and/or handshaking process to establish a HS data rate between a host and FPGA 208. It should be noted that pull-up resistor 222 can be dynamically turned on and off using a 3.3V CMOS IO set or LVCMOS 210 to either apply 3.3V or high impedance. Similarly, 45 ohm terminations on P-channel 116 and N-channel 118 can be turned on or off by setting CMOS drivers or LVDS circuits 218-220 to drive the voltage level to 0V or high impedance. In an alternative embodiment, the termination CMOS drivers such as LVDS circuits 218-220 can be replaced with LVDS33 drivers using 3.3V signaling on the line (P-channel and/or N-channel) when full speed USB communication is desired.

In operation, a bidirectional LVDS transceiver such as transceiver 312 is used to transmit to an external hub or host, not shown in FIG. 3, and if needed, transceiver 312 can also receive incoming data with a data rate of 480 Mbps. In one example, an LVDS driver can drive the line or channel, and provide a ~1.2V Vcm+/−350 mV Vdiff; 1.2+0.350/4=0.3875=−400 mV when termination is enabled on both ends. When a drive strength, for example, fails to meet the USB 2.0 specification of 17.78 mA, a CMOS transmitter, in one example, can be used to provide a drive strength that is closer to the USB 2.0 protocol or specification. While the voltage can be adjusted to provide as close to 0-400 mV, a 1.6V CMOS circuit can be an ideal situation since 1.6V/4=400 mV.

An advantage of using LVDS bidirectional transceiver in UII 306 is to enhance the flexibility of data transmission and receiving.

Figure 4:
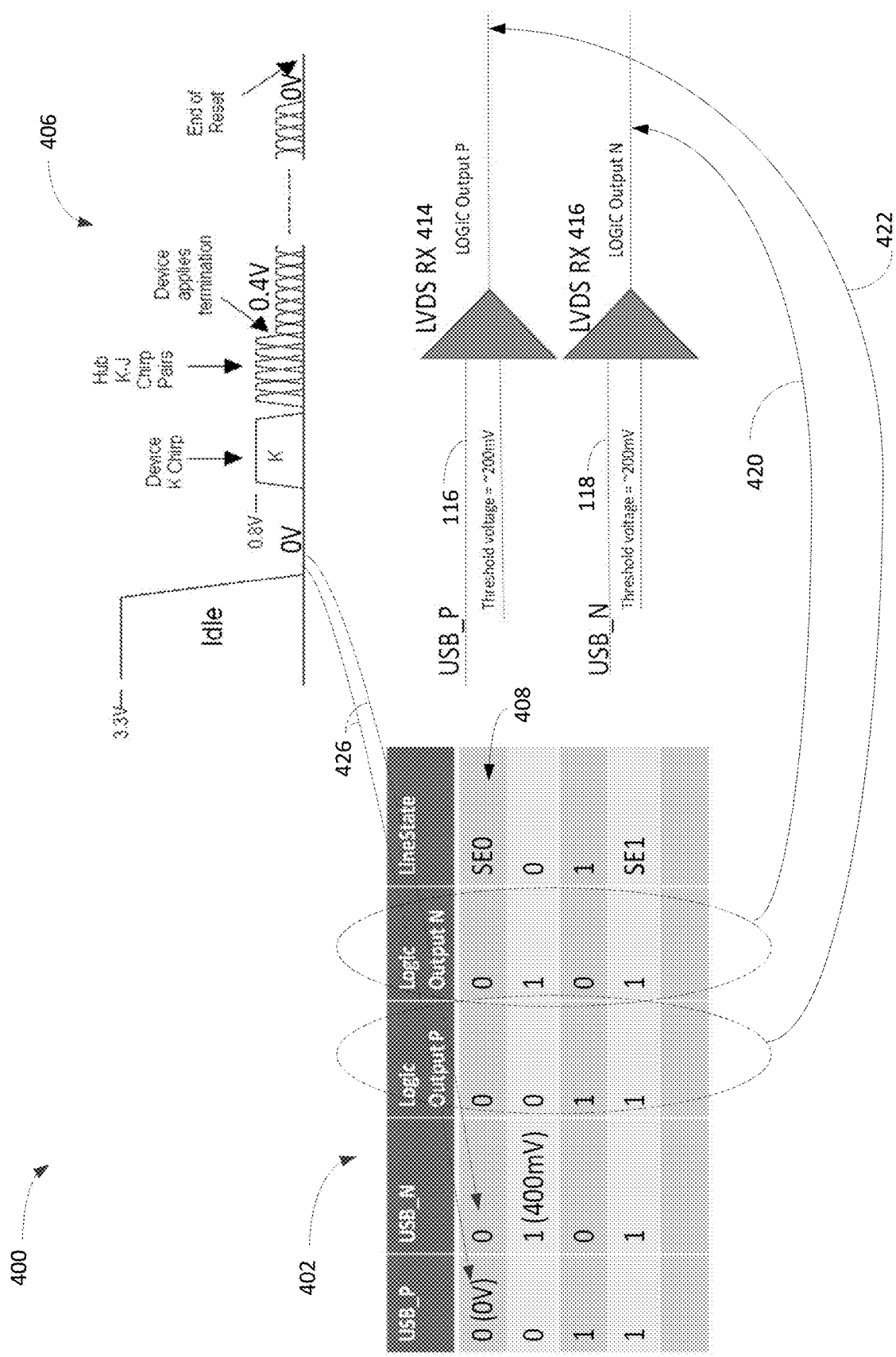
FIG. 4 is a logic diagram illustrating a process of establishing an HS mode for facilitating communication between a host and a configurable device in accordance with one embodiment of the present invention.

FIG. 4 is a logic diagram 400 illustrating a process of establishing an HS mode for facilitating communication between a host and a configurable device in accordance with one embodiment of the present invention. Diagram 400 illustrates a process of identifying line state based on input signals or data from P-channel 116 and N-channel 118. It should be noted that P-channel 116 and N-channel 118 can also be referred to as USB-P and USB-N. Diagram 400 includes a line state table 402, HS USB 2.0 negotiation chart 406, and two LVDS receivers 414-416. LVDS receivers 414-416 and table 402, in one embodiment, are implemented in UM It should be noted that the underlying concept of the exemplary embodiment(s) of the present invention would not change if one or more blocks (circuit or elements) were added to or removed from diagram 400.

Based on the illustration of HS USB 2.0 negotiation chart 406, detecting a logic zero (0) volt at both P-channel 116 and N-channel or SE0 state 408 is critical. A challenge for handling or detecting SE0 state 408 is that, under certain circumstances, LVDS circuits may not know how to handle this line condition in light of noise and/or random value sequences. To effectively detect SE0 state, a dedicated LVDS receiver 414 is used to monitor P-channel 116 and a second dedicated LVDS receiver 416 is designated to monitor N-channel 118 according to predefined threshold voltages such as 200 mV. For example, two LVDS receivers 414-416 can independently compare signals at P-channel 116 and N-channel 118 against a threshold voltage=−200 mV. It should be noted that the data may be captured without running into issues in the SE0 case since the LVDS receiver will see a logic 0 (−200 mV relative on P and N channels or lines).

In operation, LVDS receiver 414 is assigned to monitor and receive data or signals from P-channel 116 and LVDS receiver 416 is allocated to monitor and receive data or signals from N-channel 118. When P-channel 116 and N-channel 118 are driven to zero (0) volts by the host as indicated by numeral 426, LVDS receivers 414-416 detect the zero (0) volts and acknowledge zero (0) volt detection after comparing the received signals with threshold voltages. An SE0 state 408 is issued by UII when both zero (0) volts on the channels are detected and/or verified. It should be noted that the outputs of LVDS receivers 414-416 are based on the signals from P-channel 116 and N-channel 118 as indicated by numerals 420-422. It should be noted that SE1 line state can be identified by LVDS receivers 414-416 based on one (1) logic values on both channels as indicated by table 402.

Figure 5A:
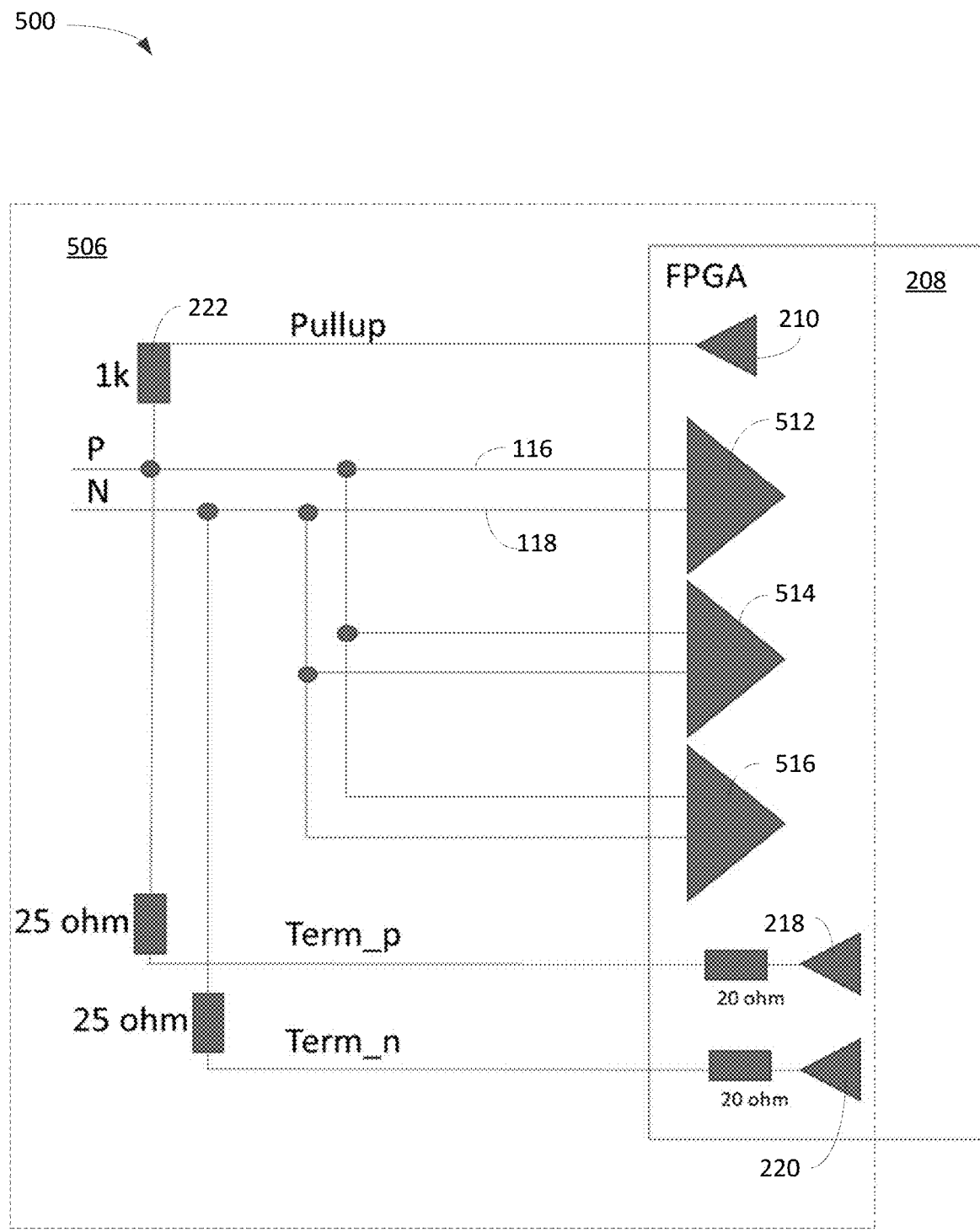
FIGS. 5A-5C are block diagrams illustrating alternative embodiments of an input output ("IO") interface for facilitating an HS data transmission between a host and an FPGA in accordance with one embodiment of the present invention.

FIG. 5A is a block diagram 500 illustrating alternative embodiments of IO interface or UII for facilitating HS data transmissions between a host and an FPGA in accordance with one embodiment of the present invention. Diagram 500 illustrates an alternative exemplary of UII 506 which uses a portion of IO components of FPGA 208 to facilitate establishing and communicating information with an external device such as a host via an HS USB 2.0 bus. UII 506 is similar to UII 306 shown in FIG. 3 except that LVDS bidirectional transceiver 312 shown in FIG. 3 is replaced with an LVDS receiver 512. It should be noted that the underlying concept of the exemplary embodiment(s) of the present invention would not change if one or more blocks (circuit or elements) were added to or removed from diagram 500.

UII 506, in one embodiment, includes a first receiver 514 and a second receiver 516 wherein first and second receivers 514-516 are differential comparators. First receiver 514, in one example, receives signals from both P-channel 116 and N-channel 118 and determines the voltage level present on P-channel 116 based on the signals or voltages received from P-channel 116 and N-channel 118. Similarly, second receiver 516, in one example, receives signals from both P-channel 116 and N-channel 118 and determines the voltage level present on N-channel 118 based on the received signals from P-channel 116 and N-channel 118. Depending on the applications, employing UII 506 can be more advantageous than the other embodiments because the predefined threshold voltages such as 200 mV are not needed in the present embodiment.

Figure 5B:
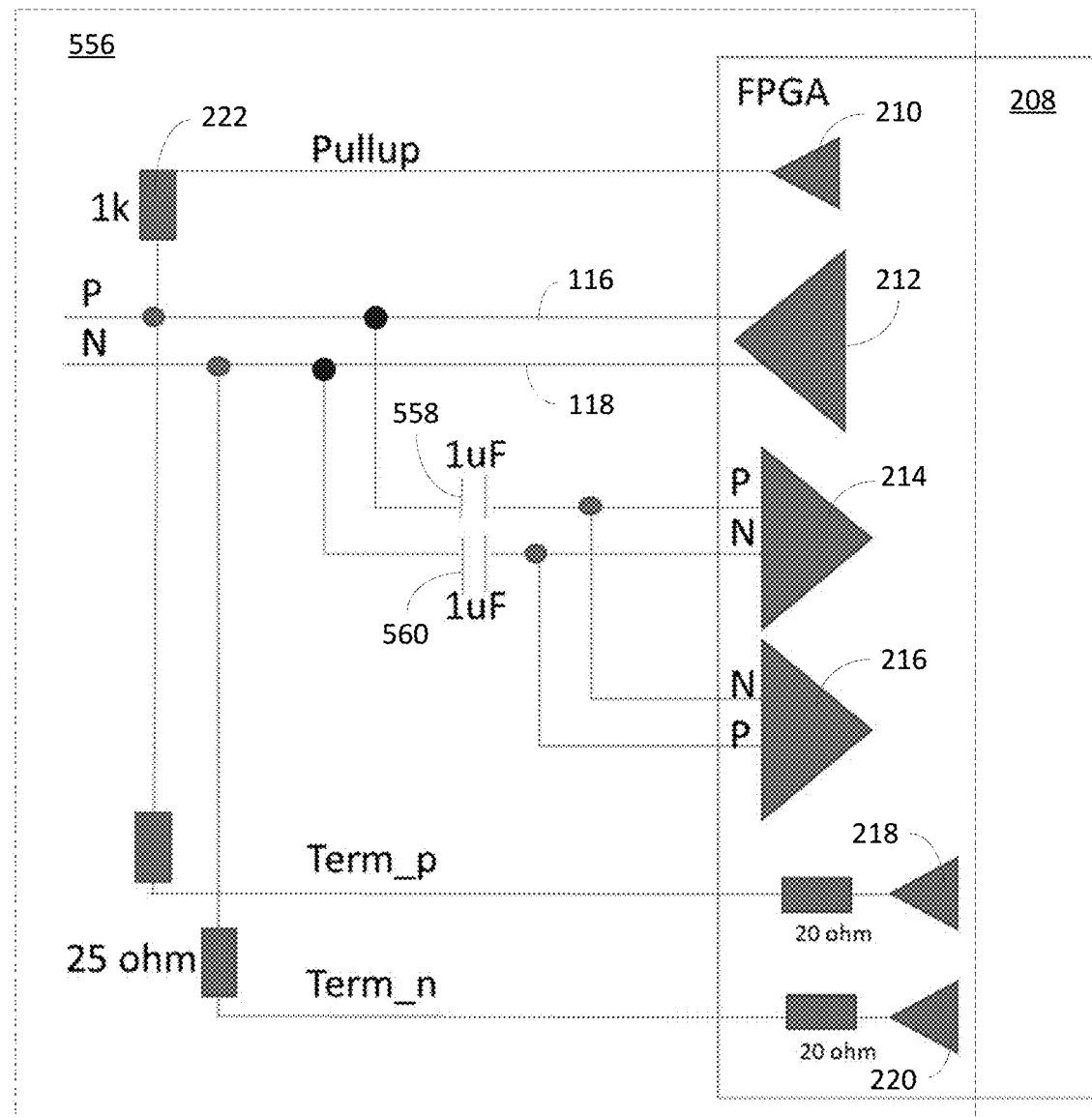

FIG. 5B is a block diagram 550 illustrating another embodiment of IO interface or UII for facilitating an HS data transmission between a host and an FPGA in accordance with one embodiment of the present invention. Diagram 550 illustrates an embodiment of UII 556 which uses a portion of IO components of FPGA 208 to facilitate establishing and communicating information with an external device such as a host via an HS USB 2.0 bus. UII 556 is similar to UII 206 shown in FIG. 2 except UII 556 uses two capacitors 558-560 instead of threshold voltages such as voltage sources with 200 mV. It should be noted that the underlying concept of the exemplary embodiment(s) of the present invention would not change if one or more blocks (circuit or elements) were added to or removed from diagram 550.

UII 556, in one embodiment, includes a first receiver 214 and a second receiver 216 which are differential comparators. First receiver 214, for example, receives signals from both P-channel 116 and N-channel 118 and determines the voltage level present on P-channel 116 based on the outputs of capacitors 558-560 which are coupled to and receive signals from P-channel 116 and N-channel 118. Similarly, second receiver 216 determines the voltage level present on N-channel 118 based on the outputs of capacitors 558-560 which are coupled to and receive signals from P-channel 116 and N-channel 118.

It should be noted that some additions may be additionally necessary depending on the type of FPGA used. For example, external resistors may be required if it is not possible to adjust the series impedance of CMOS IO to 45 ohms resistance. It should be further noted that AC (alternating current) coupling capacitors may need to be placed in series with the LVDS receivers to remove issues with line biasing in certain circuit combinations.

An advantage of using UII 556 is that it does not require a predefined threshold voltage to identify the voltage values at P-channel 116 and N-channel 118.

Figure 5C:
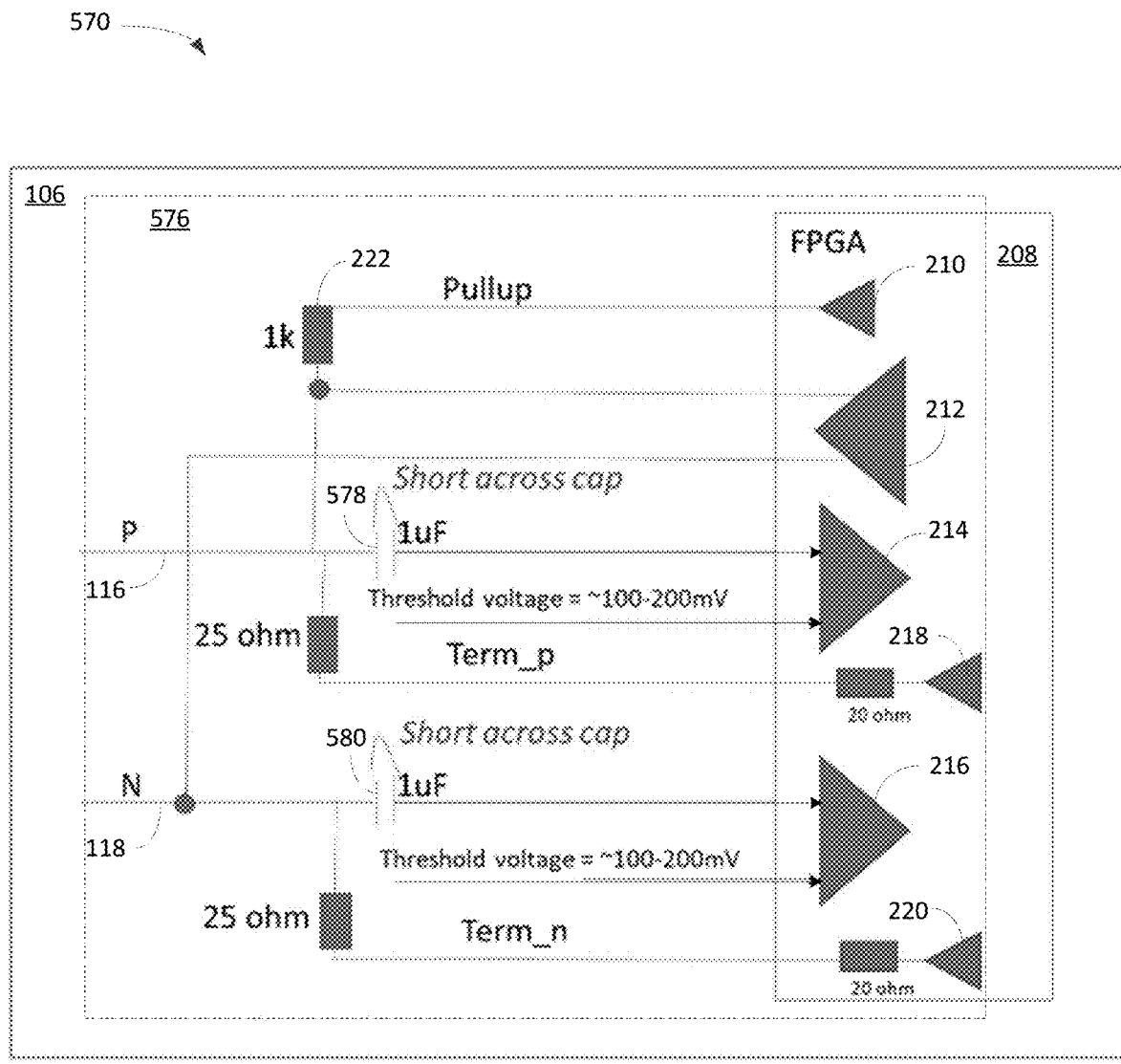

FIG. 5C is a block diagram 570 illustrating an embodiments of IO interface or UII for facilitating an HS data transmission between a host and an FPGA in accordance with one embodiment of the present invention. Diagram 570 illustrates an embodiment of UII 576 which uses a portion of IO components of FPGA 208 to facilitate establishing and communicating information with an external device such as a host via an HS USB 2.0 bus. UII 576 is similar to UII 206 shown in FIG. 2 except that UII 576 adds two capacitors 578-580 on P-channel 116 and N-channel 118, respectively. It should be noted that the underlying concept of the exemplary embodiment(s) of the present invention would not change if one or more blocks (circuit or elements) were added to or removed from diagram 570.

Depending on the applications, employing UII 576 can be more efficient than other embodiments because the addition of capacitors 578-580 used as AC coupling to enhance the accuracy of voltage detection.

Serialization/Deserialization

Figure 6:
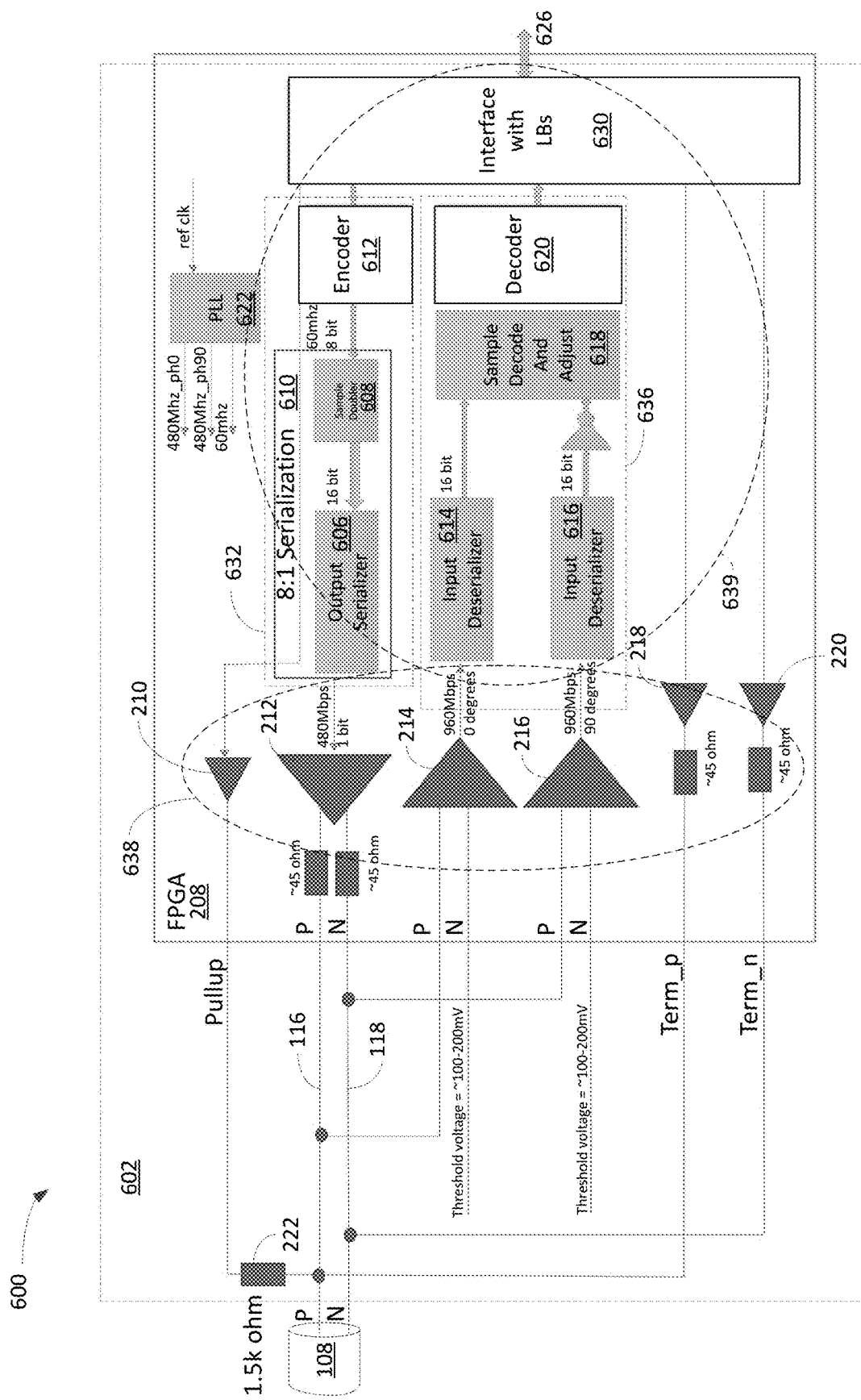
FIG. 6 is a block diagram illustrating a serializer and deserializer ("serdes") block for facilitating an HS data transmission between a host and an FPGA in accordance with one embodiment of the present invention.

FIG. 6 is a block diagram 600 illustrating a serializer and deserializer ("serdes") block ("SDB") 602 for facilitating an HS data transmission between a host and an FPGA in accordance with one embodiment of the present invention. SDB 602 includes a drive block 638 and an IO serdes block ("ISB") 639 wherein a substantial portion of drive block 638 and ISB 639 are existing blocks in FPGA 208. ISB 639 further includes a serializing block 632 and a deserializing block 636. Drive block 638 includes LVCMOS circuit 210, LVDS transmitter 212, first LVDS receiver 214, second LVDS receiver 216, and two LVCMOS circuits 218-220. It should be noted that the underlying concept of the exemplary embodiment(s) of the present invention would not change if one or more blocks (circuit or elements) were added to or removed from diagram 600.

To facilitate high-speed ("HS") serial data transmissions, SDB 602, for example, provides a serializing and deserializing function as well as multiple oversampling function. Although many bus protocols can provide HS data transmissions, USB 2.0 bus protocol is used for the forgoing discussion as an exemplary HS protocol. It should be noted that the underlying concept does not change if other bus protocols are used and/or introduced.

USB 2.0 bus protocol provides 480 Mbps HS serial data transmissions. To convert serial transmission and logic operation using at least 8-bit data byte in FPGA, ISB 639 deserializes received serial bits into 8-bit data which subsequently is fed to LBs for FPGA logic operations. For transmission, ISB 639 serializes data bits such as 8-bit data into a stream of serial bits for transmitting to a host or hub via the USB 2.0 bus.

Since the host and FPGA generally reference mutually independent clock sources, clock drift or slippage could occur. To reduce the clock drift, multiple X-time over samplings, in one embodiment, is used. Multiple X includes 2×, 4×, 8×, 16×, 32×, and the like. To simplify the forgoing discussion, a 4× oversampling is used as an exemplary oversampling process. For example, to reduce clock drift, ISB 639 uses a 4× oversampling process to enhance data integrity.

Referring back to FIG. 6, ISB 639 includes serializing block 632, deserializing block 636, encoder 612, decoder 620, and LB interface block 630. Serializing block 632, in one embodiment, includes an eight-to-one (8:1) serialization circuit 610 and an encoder 612. 8:1 serialization circuit 610 further includes an output serializer 606 and a sample doubler 608. A function of output serializer 606 is to serialize 8-bit data or information into a data stream with eight (8) bits in serial whereby the 8 serial bits can be transmitted to a host with a 480 Mbps HS data transmission via a USB 2.0 bus. Sample doubler 608, in one embodiment, is used to double or duplicate the output bits such as doubling 8 bits into 16 bits in serial. A purpose to have 16-bit serial output bits is due to the adjustment of IO ratio with regard to the deserializing operation.

Encoder 612, in one example, performs a function of encoding, packing, or preparing bits for serial transmission. For example, encoder 612 can be a non-return-to-zero inverted ("NRZI") decoder which is capable of inserting bit stuff for providing or adding clock or data edges for data integrity during the transmission. Note that bit stuff or bit stuffing is the insertion of non-information bits into data. It should be noted that other types of encoders may be used instead of NRZI, such as NRZL, NRZM, and the like.

Deserializing block 636, in one embodiment, includes two input deserializers 614-616, a sample decoder and adjuster ("SDA") 618, and a decoder 620. Each input deserializer 614 or 616 is capable of receiving bits at 960 Mbps. A function of employing two input deserializers 614-616 is to provide 4× data oversampling to reduce bit slip due to clock drift.

SDA 618, in one embodiment includes a sample decoder and a sample adjuster wherein the sample decoder is able to extract or decode data bit from multiple sampled bits. For example, SDA 618 identifies a data bit from four sampled bits. Based on the sampled data, SDA 618 can adjust the clock cycle to adjust reference clock from clock module 622 to enhance accuracy of data sampling or reduce bit slippage. For example, if a receiver such receiver 214 receives five (5) samples within a four (4) sampling window, SDA 618 can adjust the reference clock to either going faster or slower depending on the applications. Upon extracting the correct data bits, data bits are forwarded to decoder 620.

Decoder 620, in one embodiment, performs a function of decoding and/or unpacking received data. In one example, decoder 620 can be a NRZI decoder for decoding the received bit streams. A function of decoder 620 is to remove bit stuff from the received bit streams. LB interface block 630, coupling to encoder 612 and decoder 620, is configured to facilitate interface between SDB 602 and LBs of FPGA 208.

A purpose to employ SDB 602 is to make FPGA such as FPGA 208 behaving as a device with a built-in USB 2.0 physical layer or port physical layer ("PHY"). In one aspect, the USB 2.0 PHY of FPGA configures a portion of logic blocks or IO blocks arranged or configured in accordance with certain FPGA interface specifications such as USB 2.0 Transceiver Macrocell Interface ("UTMI") specification. It should be noted that logic for pull-up and/or termination can be handled by the FPGA fabric since the pull-up and/or termination have no dependency on the 480 Mbps line rate. The USB 2.0 PHY implementation, in one example, can be used with any devices or hosts having a USB host controller or USB device controller. The USB host controller or device controller, in one aspect, is configured to handle a set of transmission functions, such as, but not limited to, packet identification, depacketization, packetization, line state, CRC checking, and the like. In one example, the USB host controller or USB device controller is a serial interface engine ("SIE") which is a link layer that facilitates an FPGA containing a USB implementation (or USB 2.0 PHY) such as UII. It should be noted that the USB host controller and/or USB device controller may use SIE to assign dedicated hardware to deal with the time-critical information communication.

The LineState signal according to UTMI can be monitored by a threshold monitored LVDS receivers such as receiver 214 either directly or indirectly with a single deserialized bit based on the deserialization path used. The data stream receiving at a rate of 480 Mbps can be deserialized using a bidirectional LVDS receiver, a threshold LVDS receivers or a combination of the bidirectional LVDS receiver.

Since there is no shared clock between the host and device (i.e., FPGA), the data needs to recovered based on an independent clock source and an oversampling scheme to reduce clock drift. During the initial handshaking process such as K-J chirps, SDB 602 activates sample decoder 618 to determine whether the device clock (or FPGA drive clock) is running slower or faster than the host clock. For example, bit slips can be monitored by SDA 618 based on the oversampling of deserializer as well as looking for uneven numbers of samples. Since the IO capabilities for a traditional FPGA does not operate at a rate of 1.920 Gbps (480 Mbps×4), two deserializers such as deserializers 614-616 are used for performing 4× oversampling because FPGA generally can provide 1 Gbps at its IO blocks. To sampling effectively, additional phase shifts between IO sampling of threshold IO and/or bidirectional LVDS transceiver are used. In one aspect, FPGA IO should be able to handle 2× oversampling at 960 Mbps. For example, a system with 2× oversampling per deserializer along with phase shifted sampling to produce 4× oversampling. 1:16 gearing ratio may be used because the 8-bit deserialized rate should fall at 60 MHz (480 mbps/8=60 mhz) which is the same as 960 mbps/16 mbps. 60 MHz (megahertz) fabric clock is available at the FPGA fabric. It should be noted that 1:8 gearing may be used along with a 2:1 ratio cross-clock FIFO to reduce clock and data from 120 MHz to 60 MHz bus rate.

SDB 602 containing configurable device such as a programmable device able to perform user configurable logic functions includes a bus 108, a first input deserializer 614, and a second input deserializer 616. Bus 108 includes P-channel 116 and N-channel 118 operable to transmit signals in accordance with an HS USB protocol such as USB 2.0. First input deserializer 614 is coupled to P-channel 116 and configured to obtain first two samples of data signals on P-channel 116 in accordance with a first clock clocking twice the speed of data rate at P-channel 116 such as 960 Mbps. Second input deserializer 616 is coupled to N-channel 118 and configured to obtain second two samples of data signals on N-channel 118 in accordance with a second clock with a ninety (90) degree phase shift having a clock cycle clocking twice the speed of data rate at N-channel 118.

FPGA 208, in one aspect, provides its existing TO, serializing, and deserializing logic elements to facilitate functions of SDB 602. For example, FPGA 208 assigns a portion of IO logic to perform functions of drive block 638 and a portion of serializing and deserializing logic to perform functions of ISB 639. FPGA 208 further includes arrays of configurable LBs capable of being selectively programmed to perform one or more user defined logic functions.

SDB 602 further includes an SDA 618, a decoder 620, and a clock module 622. In one embodiment, SDA 618 includes a sample decoder and a sampling adjuster. A function of the sample decoder is to generate decoded data based on multiple samples such as 4X oversampling based on the first two samples of data signals from first input deserializer 614 and the second two samples of data signals from second input deserializer 616. The sampling adjuster, in one example, is able to adjust clocking times for the first clock and the second clock to compensate bit slips due to clock drift in response to the first two samples and the second two samples. In one aspect, the first clock is referring to a clock cycle clocking at 960 Mbps and the second clock is referring to clock cycle clocking at 960 Mbps with a ninety (90) degree phase shift. A clock block or module 622 in FPGA is able to provide a first clock running 480 MHz with a zero (0) degree phase shift, a second clock running 480 MHz with a 90 degrees phase shift, and a third clock running 60 Mhz.

In operation, the first clock is clocking at 0 degree and 180 degree sampling time slots and the second clock is clocking at 90 degree and 270 degree sampling time slots. In one embodiment, first input deserializer 614 performs two samplings to generate 16 bits sampling signals with 8 bits data transmitting at a speed of 960 Mbps. Similarly, second input deserializer 616 performs two samplings to generate 16 bits sampling signals with 8 bits actual data transmitting at a speed of 960 Mbps with a 90-degree phase shift. Decoder 620, in one embodiment, is an NRZI decoder configured to generate data by removing bit stuff from the decoded data.

Serializing block 632 wherein serializing block 632, coupling to transmitter 212, includes an 8:1 output serializer 606, sample doubler 608, and encoder 612. In one embodiment, serializing block 632 transmits a sequence of bits (with 8 bits data) based on a third clock having a clock speed of 480 Mbps via transmitter 212. Encoder 612 is an NRZI encoder capable of encoding eight (8) bits data obtained from one or more configurable LBs. Eight-to-one ("8:1") output serializer 610 is able to serialize 8 bits data into a stream of 8 bits in serial for an HS data transmission.

An advantage of employing SDB 602 for interfacing between a host and FPGA is to perform a process of oversampling using FPGA clock signals. Another advantage of employing SBD 602 is that it is able to facilitate serdes operation at 480 Mbps data rate at FPGA without employing a CDR (clock data recovery) circuit or any other special clock synchronizing circuitry.

Programmable Semiconductor Device (PSD)

Figure 7A:
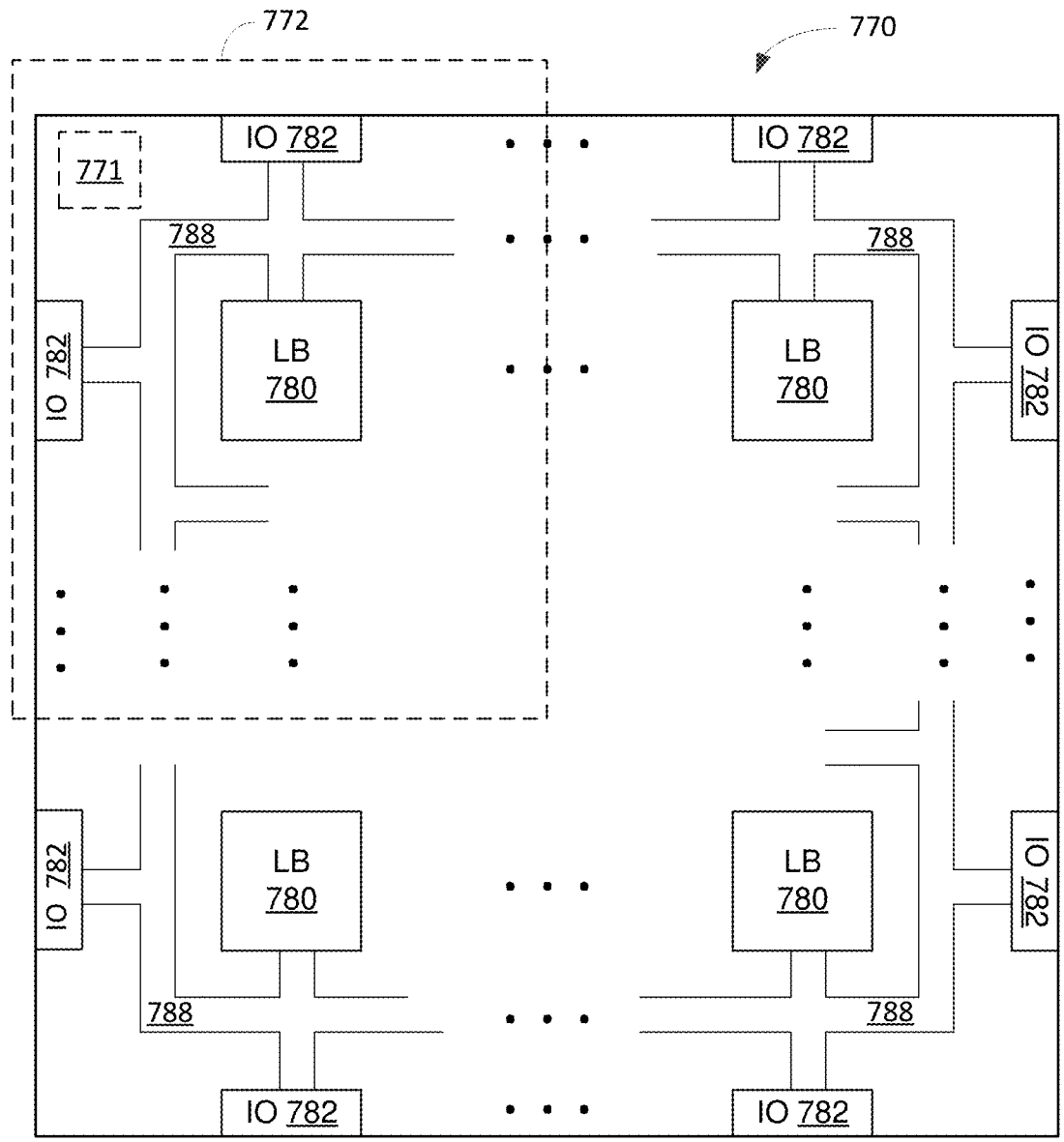
FIGS. 7A-7C are block diagrams illustrating a programmable semiconductor device ("PSD") or FPGA able to facilitate HS data transmission in accordance with one embodiment of the present invention.

FIG. 7A is a block diagram 770 illustrating a programmable semiconductor device ("PSD") or FPGA able to facilitate HS data transmission in accordance with one embodiment of the present invention. PSD, also known as FPGA, PIC, and/or a type of Programmable Logic Device ("PLD"), includes an UII and/or a SDB capable of facilitating USB 2.0 data transmission. A function of UII and/or SDB is to use a portion of PSD existing logic blocks such as block 720 to facilitate HS USB 2.0 data transmission so that it enhances overall versatilities as well as the efficiency of PSD. It should be noted that the underlying concept of the exemplary embodiment(s) of the present invention would not change if one or more blocks (circuit or elements) were added to or removed from diagram 770.

PSD includes an array of configurable LBs 780 surrounded by input/output blocks ("IOs") 782, and programmable interconnect resources 788 ("PIR") that include vertical interconnections and horizontal interconnections extending between the rows and columns of logic block ("LB") 780 and IO 782. PRI 788 may further include interconnecting array decoders ("IAD") or programmable interconnection array ("PIA"). It should be noted that the terms PRI, IAD, and PIA may be used interchangeably hereinafter.

Each LB, in one example, includes programmable combinational circuitry and selectable output registers programmed to implement at least a portion of a user's logic function. The programmable interconnections, connections, or channels of interconnect resources are configured using various switches to generate signal paths between the LBs 780 for performing logic functions. Each IO 782 is programmable to selectively use an IO pin (not shown) of PSD.

PIC, in one embodiment, can be divided into multiple programmable partitioned regions ("PPRs") 772 wherein each PPR 772 includes a portion of LBs 780, some PPRs 788, and IOs 782. A benefit of organizing PIC into multiple PPRs 772 is to optimize management of storage capacity, power supply, and/or network transmission.

Bitstream is a binary sequence (or a file) containing programming information or data for a PIC, FPGA, or PLD. The bitstream is created to reflect the user's logic functions together with certain controlling information. For an FPGA or PLD to function properly, at least a portion of the registers or flipflops in FPGA needs to be programmed or configured before it can function. It should be noted that bitstream is used as input configuration data to FPGA.

A benefit of using the UII and SDB process is to facilitate HS USB 2.0 data transmission between a host and PSD or FPGA.

Figure 7B:
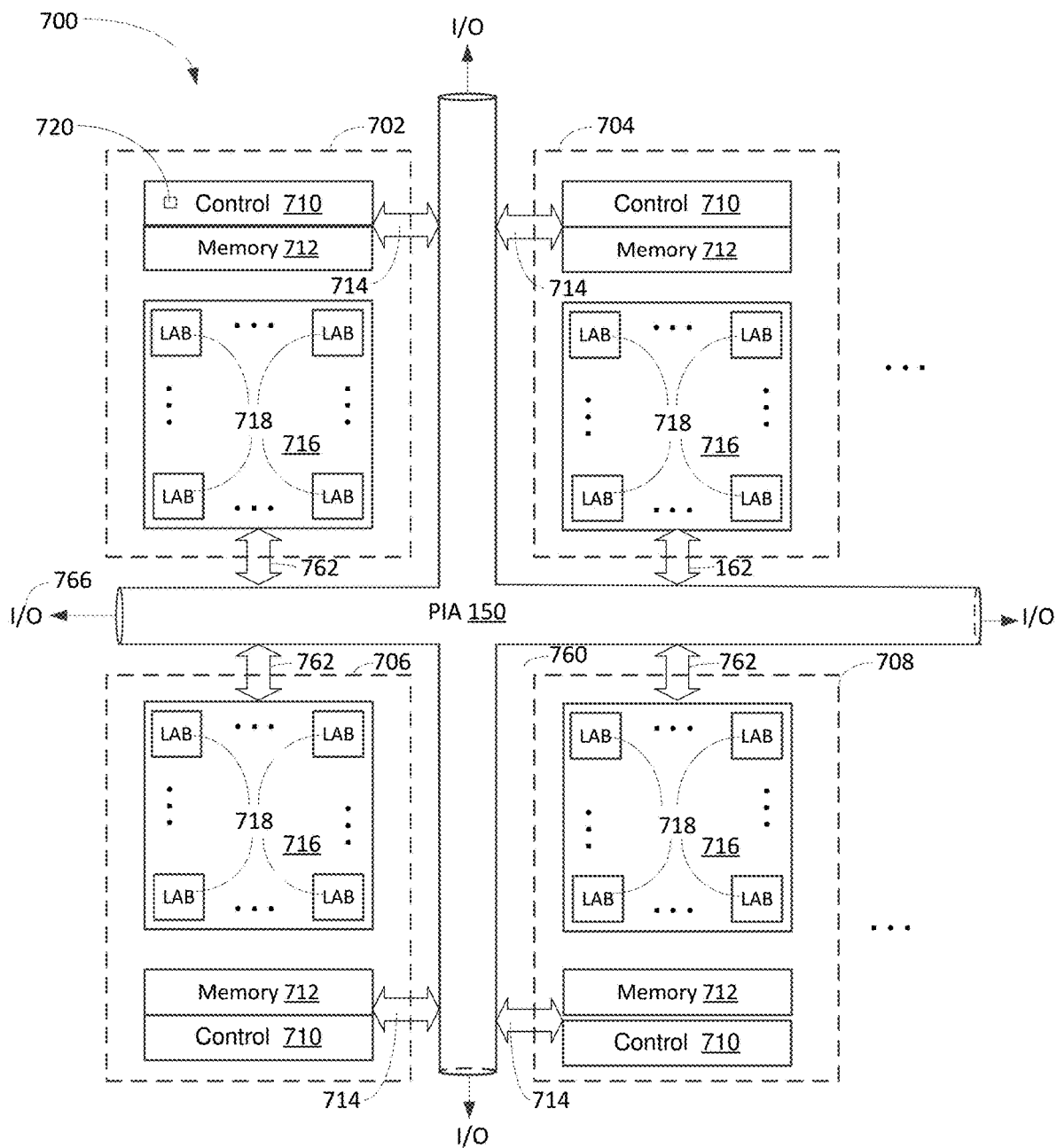

FIG. 7B is block diagrams illustrating a PSD operable to carry out various user-defined logic operations using UII and SDB in accordance with one embodiment of the present invention. To simplify the foregoing discussion, the terms "PSD", "PIC", FPGA, and PLD are referring the same or similar devices and they can be used interchangeably hereinafter. Diagram 700 includes multiple PPRs 702-708, PIA 750, and regional IO ports 766. PPRs 702-708 further includes control units 710, memory 712, and LBs 716. Note that control units 710 can be configured into one single control unit, and similarly, memory 712 can also be configured into one single memory for storing configurations. It should be noted that the underlying concept of the exemplary embodiment(s) of the present invention would not change if one or more blocks (circuit or elements) were added to or removed from diagram 700.

LBs 716, also known as configurable function unit ("CFU") include multiple logic array blocks ("LABs") 718 which is also known as a configurable logic unit ("CLU"). Each LAB 716, for example, can be further organized to include, among other circuits, a set of programmable logical elements ("LEs"), configurable logic slices ("CLS"), or macrocells, not shown in FIG. 7B. Each LAB, in one example, may include anywhere from 32 to 512 programmable LEs. IO pins (not shown in FIG. 7B), LABs, and LEs are linked by PIA 750 and/or other buses, such as buses 762 or 714, for facilitating communication between PIA 750 and PPRs 702-708.

Each LE includes programmable circuits such as the product-term matrix, lookup tables, and/or registers. LE is also known as a cell, configurable logic block ("CLB"), slice, CFU, macrocell, and the like. Each LE can be independently configured to perform sequential and/or combinatorial logic operation(s). It should be noted that the underlying concept of PSD would not change if one or more blocks and/or circuits were added or removed from PSD.

Control units 710, also known as configuration logics, can be a single control unit. Control unit 710, for instance, manages and/or configures individual LE in LAB 718 based on the configuring information stored in memory 712. It should be noted that some IO ports or IO pins are configurable so that they can be configured as input pins and/or output pins. Some IO pins are programmed as bi-directional IO pins while other IO pins are programmed as unidirectional IO pins. The control units such as unit 710 are used to handle and/or manage PSD operations in accordance with system clock signals.

LBs 716 include multiple LABs that can be programmed by the end-user(s). Each LAB contains multiple LEs wherein each LE further includes one or more lookup tables ("LUTs") as well as one or more registers (or D flip-flops or latches). Depending on the applications, LEs can be configured to perform user-specific functions based on a predefined functional library facilitated by the configuration software. PSD, in some applications, also includes a set fixed circuit for performing specific functions. For example, the fixed circuits include, but not limited to, a processor(s), a DSP (digital signal processing) unit(s), a wireless transceiver(s), and so forth.

PIA 750 is coupled to LBs 716 via various internal buses such as buses 714 or 762. In some embodiments, buses 714 or 762 are part of PIA 750. Each bus includes channels or wires for transmitting signals. It should be noted that the terms channel, routing channel, wire, bus, connection, and interconnection are referred to as the same or similar connections and will be used interchangeably herein. PIA 750 can also be used to receive and/or transmits data directly or indirectly from/to other devices via IO pins and LABs.

Memory 712 may include multiple storage units situated across a PPR. Alternatively, memories 712 can be combined into one single memory unit in PSD. In one embodiment, memory 712 is an NVM storage unit used for both configuration and user memory. The NVM storage unit can be, but not limited to, MRAM, flash, Ferroelectric RAM, and/or phase changing memory (or chalcogenide RAM). Depending on the applications, a portion of the memory 712 can be designated, allocated, or configured to be a block RAM ("BRAM") used for storing large amounts of data in PSD.

A PSD includes many programmable or configurable LBs 716 that are interconnected by PIA 750, wherein each programmable LB is further divided into multiple LABs 718. Each LAB 718 further includes many LUTs, multiplexers and/or registers. During configuration, a user programs a truth table for each LUT to implement a desired logical function. It should be noted that each LAB, which can be further organized to include multiple logic elements ("LEs"), can be considered as a configurable logic cell ("CLC") or slice. For example, a four-input (16 bit) LUT receives LUT inputs from a routing structure (not shown in FIG. 7B). Based upon the truth table programmed into LUT during configuration of PSD, a combinatorial output is generated via a programmed truth table of LUT in accordance with the logic values of LUT inputs. The combinatorial output is subsequently latched or buffered in a register or flip-flop before the clock cycle ends.

In one embodiment, control unit 710 includes an UII and/or SDB component 720. It should be noted that UII and/or SDB component 720 can be placed anywhere within PIC or PSD for facilitating the HS USB 2.0 data process.

Figure 7C:
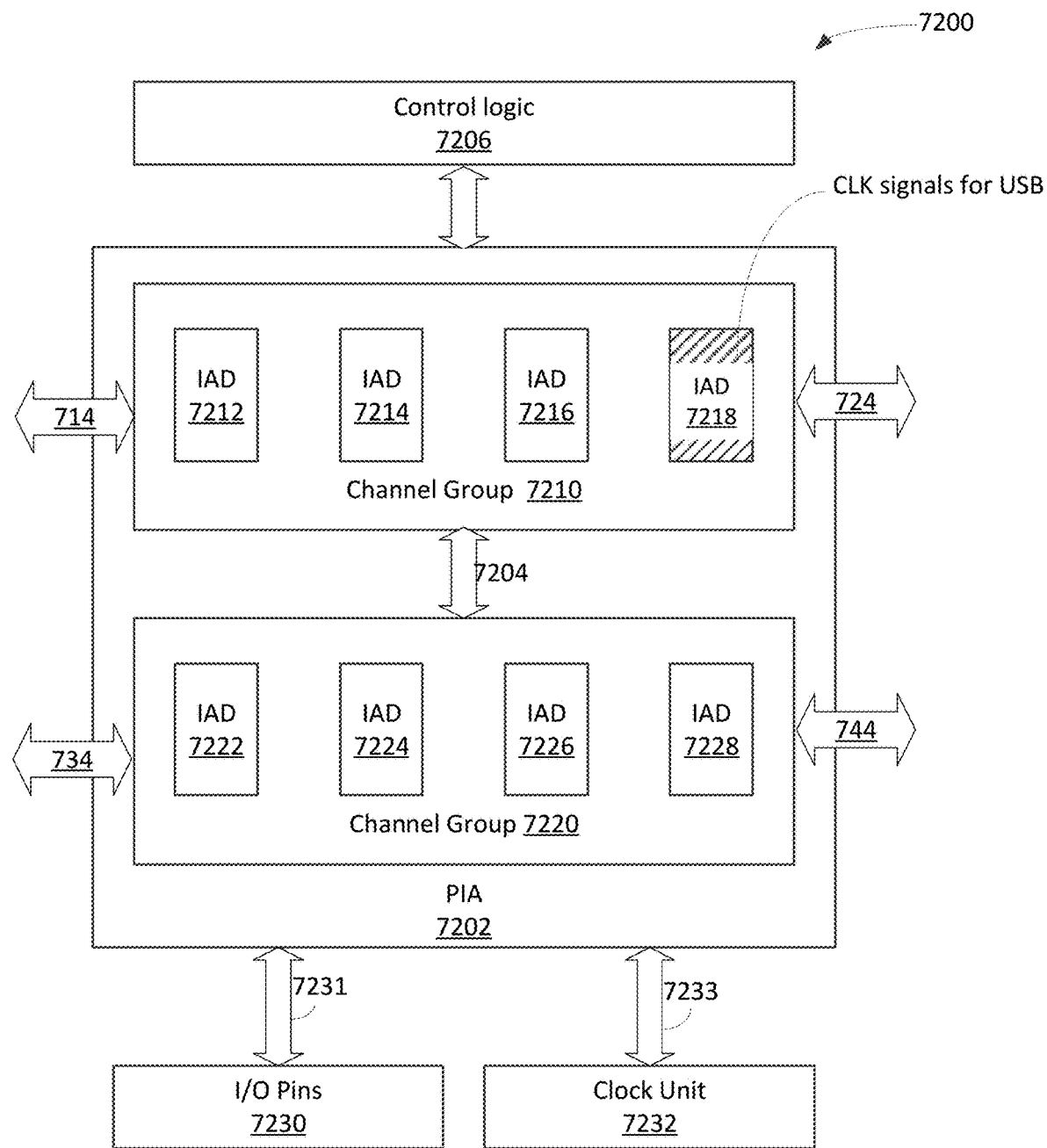

FIG. 7C is a block diagram 7200 illustrating a routing logic or routing fabric containing programmable interconnection arrays capable of routing data and/or clock signals distributed by UII and/or SDB in accordance with one embodiment of the present invention. Diagram 7200 includes control logic 7206, PIA 7202, IO pins 7230, and clock unit 7232. Control logic 7206, which may be similar to control units shown in FIG. 7C, provides various control functions including channel assignment, differential IO standards, and clock management. Control logic 7206 may contain volatile memory, non-volatile memory, and/or a combination of the volatile and nonvolatile memory device for storing information such as configuration data. In one embodiment, control logic 7206 is incorporated into PIA 7202. It should be noted that the underlying concept of the exemplary embodiment(s) of the present invention would not change if one or more blocks (circuit or elements) were added to or removed from diagram 7200.

IO pins 7230, connected to PIA 7202 via a bus 7231, contain many programmable IO pins configured to receive and/or transmit signals to external devices. Each programmable IO pin, for instance, can be configured to input, output, and/or bi-directional pin. Depending on the applications, IO pins 7230 may be incorporated into control logic 7206.

Clock unit 7232, in one example, connected to PIA 7202 via a bus 7233, receives various clock signals from other components, such as a clock tree circuit or a global clock oscillator. Clock unit 7232, in one instance, generates clock signals in response to system clocks as well as reference clocks for implementing IO communications. Depending on the applications, clock unit 7232, for example, provides clock signals to PIA 7202 including reference clock(s).

PIA 7202, in one aspect, is organized into an array scheme including channel groups 7210 and 7220, bus 7204, and IO buses 714, 724, 734, 744. Channel groups 7210, 7220 are used to facilitate routing information between LBs based on PIA configurations. Channel groups can also communicate with each other via internal buses or connections such as bus 7204. Channel group 7210 further includes interconnecting array decoders ("IADs") 7212-7218. Channel group 7220 includes four IADs 7222-7228. A function of IAD is to provide configurable routing resources for data transmission.

IAD such as IAD 7212 includes routing multiplexers or selectors for routing signals between IO pins, feedback outputs, and/or LAB inputs to reach their destinations. For example, an IAD can include up to 36 multiplexers which can be laid out in four banks wherein each bank contains nine rows of multiplexers. It should be noted that the number of IADs within each channel group is a function of the number of LEs within the LAB.

PIA 7202, in one embodiment, designates a special IAD such as IAD 7218 for facilitating HS data transmission as well as clock signals. For example, IAD 7218 handles or distributes connections and/or routings HS data transmission during IO interface as well as serial/deserial operations.

Systems and Network Systems

Figure 8:
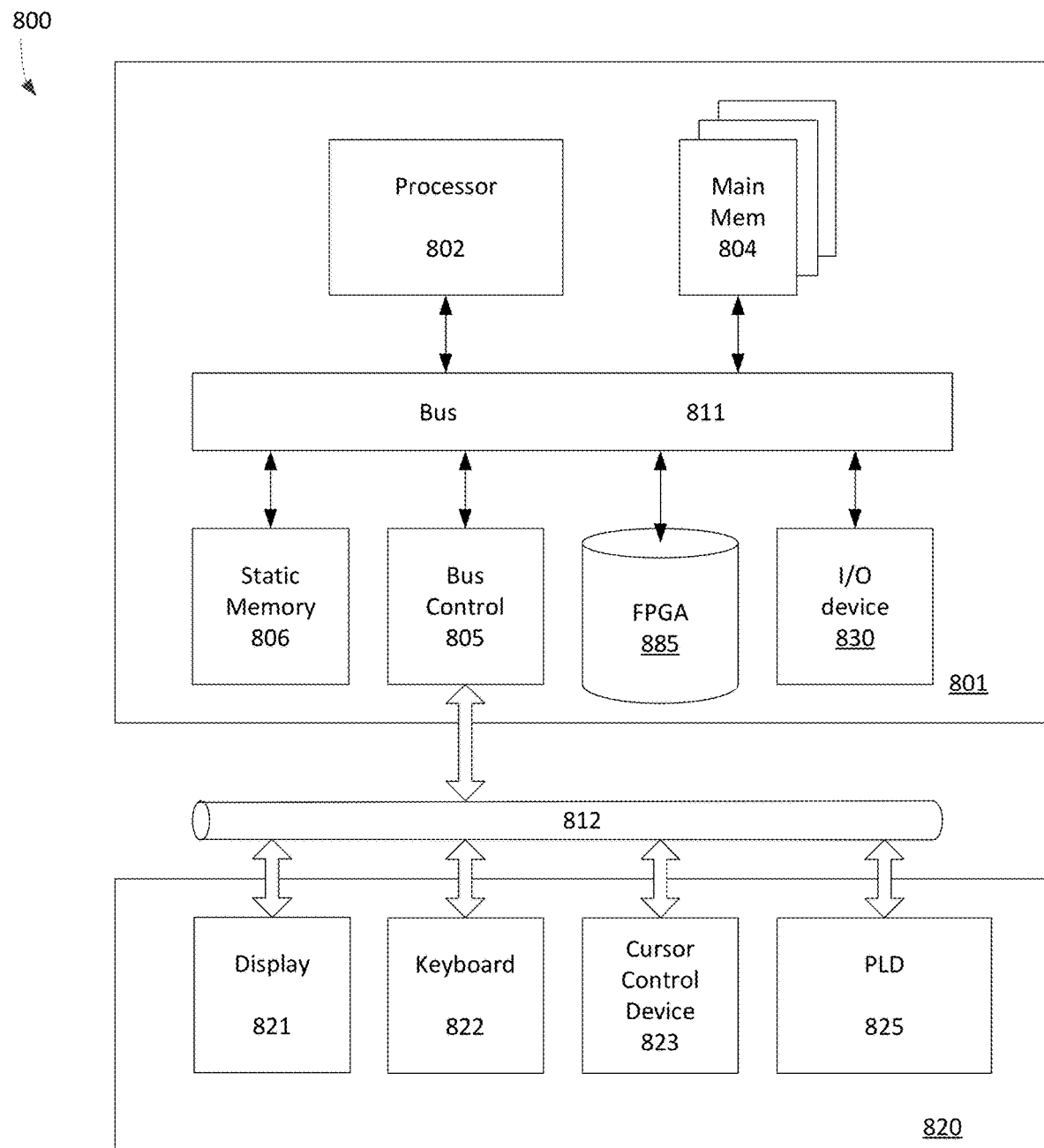
FIG. 8 is a diagram illustrating a system or computer using PSD with HS data transmission to enhance programmability of PSD in accordance with one embodiment of the present invention.

FIG. 8 is a diagram 800 illustrating a system or computer using PSD with HS data transmission to enhance programmability of PSD in accordance with one embodiment of the present invention. Computer system 800 includes a processing unit 801, an interface bus 812, and an input/output ("IO") unit 820. Processing unit 801 includes a processor 802, main memory 804, system bus 811, static memory device 806, bus control unit 805, IO element 830, and FPGA 885. It should be noted that the underlying concept of the exemplary embodiment(s) of the present invention would not change if one or more blocks (circuit or elements) were added to or removed from FIG. 8.

Bus 811 is used to transmit information between various components and processor 802 for data processing. Processor 802 may be any of a wide variety of general-purpose processors, embedded processors, or microprocessors such as ARM® embedded processors, Intel® Core™ Duo, Core™ Quad, Xeon®, Pentium™ microprocessor, Motorola™ 68040, AMD® family processors, or Power PC™ microprocessor.

Main memory 804, which may include multiple levels of cache memories, stores frequently used data and instructions. Main memory 804 may be RAM (random access memory), MRAM (magnetic RAM), or flash memory. Static memory 806 may be a ROM (read-only memory), which is coupled to bus 811, for storing static information and/or instructions. Bus control unit 805 is coupled to buses 811-812 and controls which component, such as main memory 804 or processor 802, can use the bus. Bus control unit 805 manages the communications between bus 811 and bus 812. Mass storage memory or SSD which may be a magnetic disk, an optical disk, hard disk drive, floppy disk, CD-ROM, and/or flash memories are used for storing large amounts of data.

IO unit 820, in one embodiment, includes a display 821, keyboard 822, cursor control device 823, and low-power PLD 825. Display device 821 may be a liquid crystal device, cathode ray tube ("CRT"), touch-screen display, or other suitable display devices. Display 821 projects or displays images of a graphical planning board. Keyboard 822 may be a conventional alphanumeric input device for communicating information between computer system 800 and computer operator(s). Another type of user input device is cursor control device 823, such as a conventional mouse, touch mouse, trackball, or other types of the cursor for communicating information between system 800 and user(s).

PLD 825 is coupled to bus 812 for providing configurable logic functions to local as well as remote computers or servers through a wide-area network. PLD 825 and/or FPGA 885 are configured to facilitate the operation of UII and/or SDB to improve overall efficiency of FPGA and/or PLD. In one example, PLD 825 may be used in a modem or a network interface device for facilitating communication between computer 800 and the network. Computer system 800 may be coupled to servers via a network infrastructure as illustrated in the following discussion.

Figure 9:
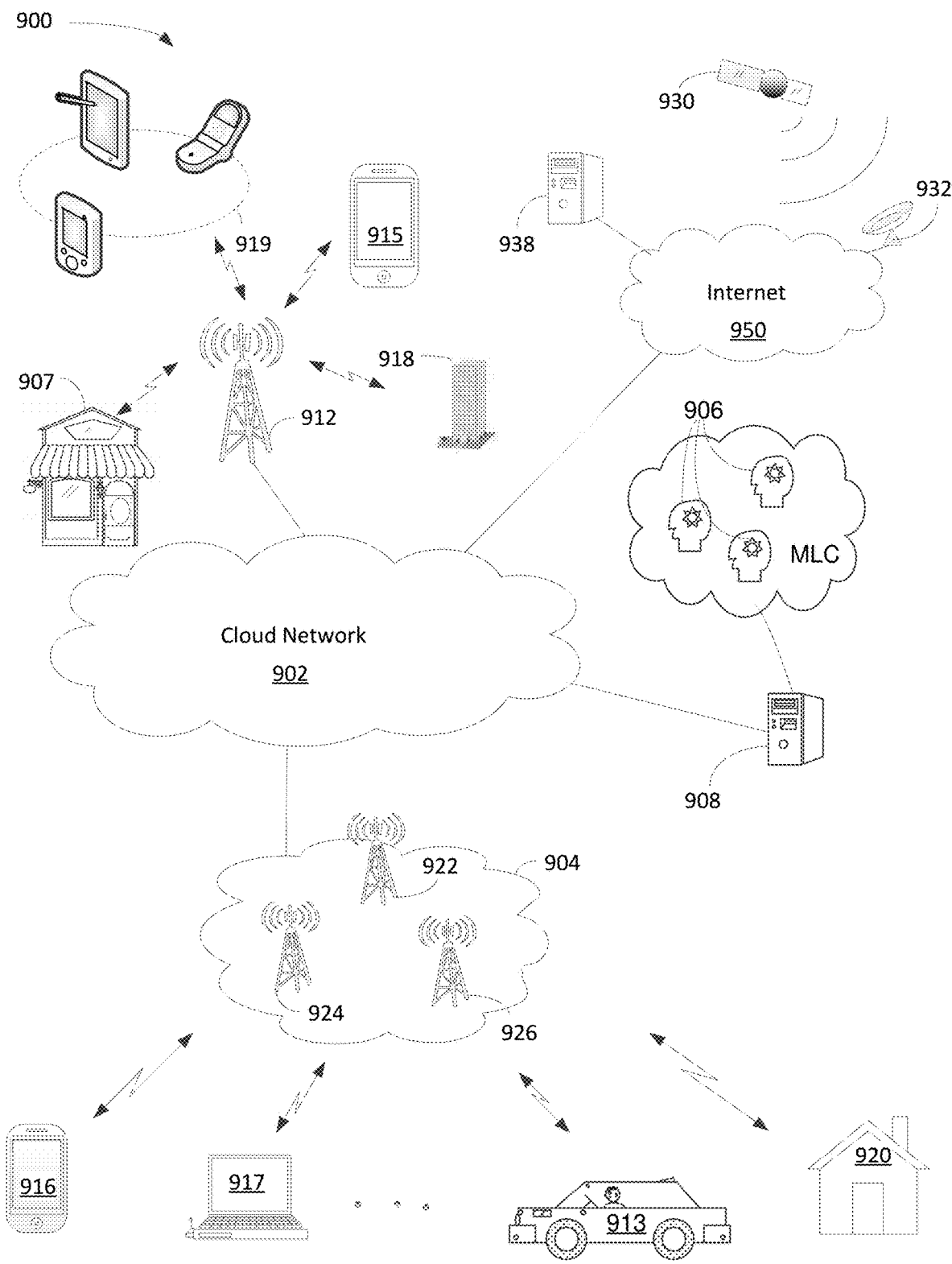
FIG. 9 is a block diagram illustrating various applications of PSD (e.g., FPGA, PLD, etc.) capable of facilitating user-defined logic functions using HS data transmission in accordance with one embodiment of the present invention.

FIG. 9 is a block diagram 900 illustrating various applications of PSD (e.g., FPGA, PLD, etc.) capable of facilitating user-defined logic functions using HS data transmission in accordance with one embodiment of the present invention. Diagram 900 illustrates AI server 908, communication network 902, switching network 904, Internet 950, and portable electric devices 913-919. In one aspect, PSD capable of facilitating UII and/or SDB operation is used in an AI server, portable electric devices, and/or switching network. Network or cloud network 902 can be a wide area network, metropolitan area network ("MAN"), local area network ("LAN"), satellite/terrestrial network, or a combination of a wide-area network, MAN, and LAN. It should be noted that the underlying concept of the exemplary embodiment(s) of the present invention would not change if one or more blocks (or networks) were added to or removed from diagram 900.

Network 902 includes multiple network nodes, not shown in FIG. 9, wherein each node may include mobility management entity ("MME"), radio network controller ("RNC"), serving gateway ("S-GW"), packet data network gateway ("P-GW"), or Home Agent to provide various network functions. Network 902 is coupled to Internet 950, AI server 908, base station 912, and switching network 904. Server 908, in one embodiment, includes machine learning computers ("MLC") 906.

Switching network 904, which can be referred to as packet core network, includes cell sites 922-926 capable of providing radio access communication, such as 3G ($3^{rd}$ generation), 4G, or 5G cellular networks. Switching network 904, in one example, includes IP and/or Multiprotocol Label Switching ("MPLS") based network capable of operating at a layer of Open Systems Interconnection Basic Reference Model ("OSI model") for information transfer between clients and network servers. In one embodiment, switching network 904 is logically coupling multiple users and/or mobiles 916-920 across a geographic area via cellular and/or wireless networks. It should be noted that the geographic area may refer to campus, city, metropolitan area, country, continent, or the like.

Base station 912, also known as cell-site, node B, or eNodeB, includes a radio tower capable of coupling to various user equipments ("UEs") and/or electrical user equipments ("EUEs"). The term UEs and EUEs are referring to similar portable devices and they can be used interchangeably. For example, UEs or PEDs can be cellular phone 915, laptop computer 917, iPhone® 916, tablets, and/or iPad® 919 via wireless communications. A handheld device can also be a smartphone, such as iPhone®, BlackBerry®, Android®, and so on. Base station 912, in one example, facilitates network communication between mobile devices such as portable handheld device 913-919 via wired and wireless communications networks. It should be noted that base station 912 may include additional radio towers as well as other land switching circuitry.

Internet 950 is a computing network using Transmission Control Protocol/Internet Protocol ("TCP/IP") to provide linkage between geographically separated devices for communication. Internet 950, in one example, couples to supplier server 938 and satellite network 930 via satellite receiver 932. Satellite network 930, in one example, can provide many functions as wireless communication as well as a global positioning system ("GPS"). It should be noted that the UII and/or SDB operation enhancing efficiency of FPGA can benefit many applications, such as but not limited to, smartphones 913-919, satellite network 930, automobiles 913, AI servers 908, business 907, and homes 920.

The exemplary embodiment of the present invention includes various processing steps, which will be described below. The steps of the embodiment may be embodied in machine or computer-executable instructions. The instructions can be used to cause a general-purpose or special-purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 10:
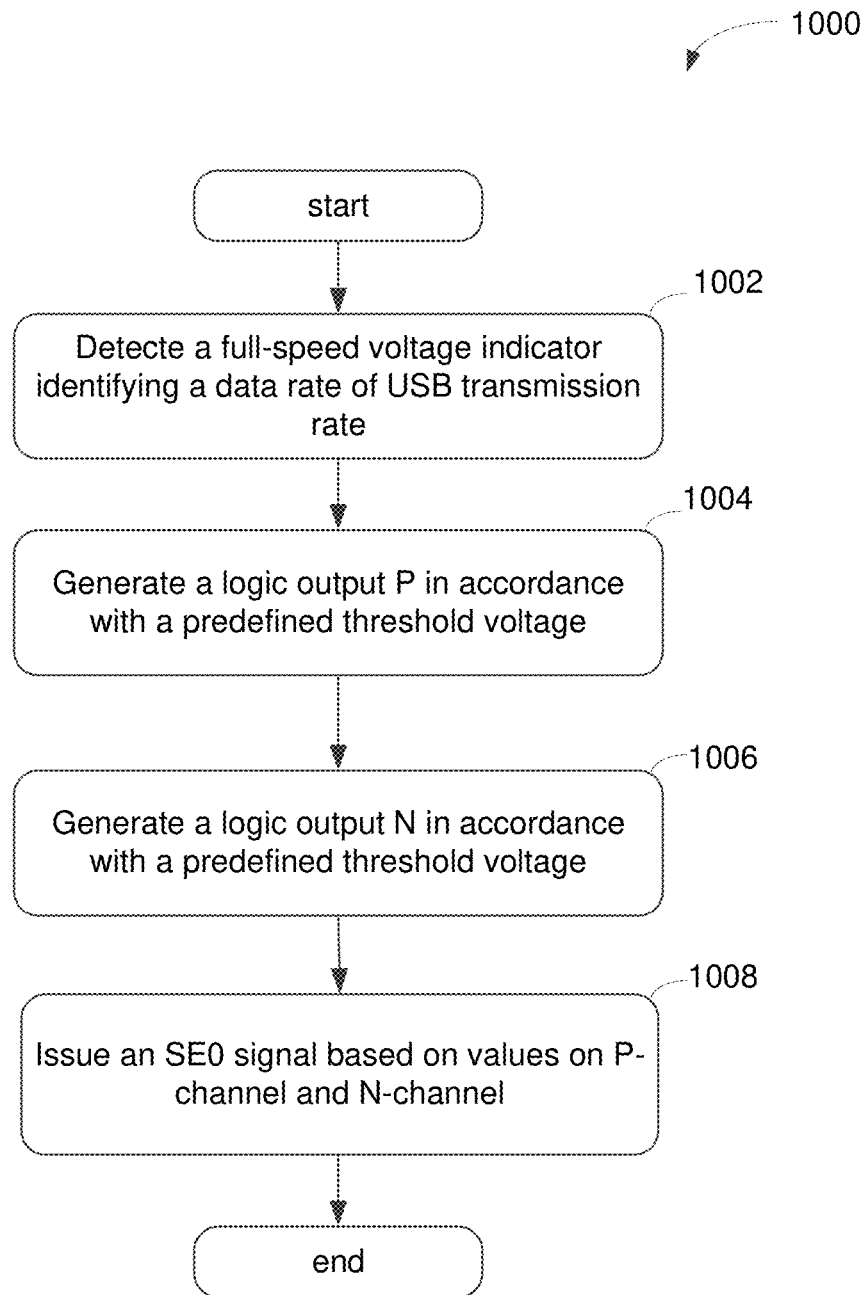
FIG. 10 is a flowchart illustrating a process of TO interface for facilitating an HS data transmission between a host and a PSD or FPGA in accordance with one embodiment of the present invention.

FIG. 10 is a flowchart 1000 illustrating a process of IO interface for facilitating an HS data transmission between a host and a PSD or FPGA in accordance with one embodiment of the present invention. At block 1002, a process for facilitating an HS data communication via a USB 2.0 IO bus between a host and an FPGA detects an HS voltage indicator identifying a data rate of a first USB transmission rate. For example, the process reads 3.3 volts as the HS voltage at the P-channel.

At block 1004, a logic output P (signal related to the P-channel) or output of a first receiver is generated by a first differential comparator based on a logic value presented at the P-channel of the USB 2.0 IO bus as well as a predefined threshold voltage. For example, the first differential comparator compares the logic value at the P-channel with a predefined threshold voltage to identify the logic value. The threshold voltage, for example, can be approximately 200 mV. If the logic value is greater than threshold voltage of 200 mV, the first differential comparator generates a logic one (1) value. If, however, the logic value is less or equal to a threshold voltage of 200 mV, the first differential comparator generates a logic zero (0) value.

At block 1006, a logic output N (signal related to the N-channel) or output of a second receiver is generated by a second differential comparator according to a logic value at the N-channel and a threshold voltage of 200 mV.

At block 1008, the process is capable of issuing an SE0 signal indicating both the P-channel and the N-channel containing logic zero values based on the logic output N and the logic output P. In one embodiment, a bidirectional differential transceiver is activated to generate an output on the P-channel and maintains the output for a predefined period of time as K-chirp to indicate that FPGA is HS ready or capable. After receiving HS initializing signals from the host for K-J chirp pairs for establishing HS data communication, a pull-up resistance is removed from the P-channel to drop operation voltage for the HS USB 2.0 data transmission between host and FPGA.

Figure 11:
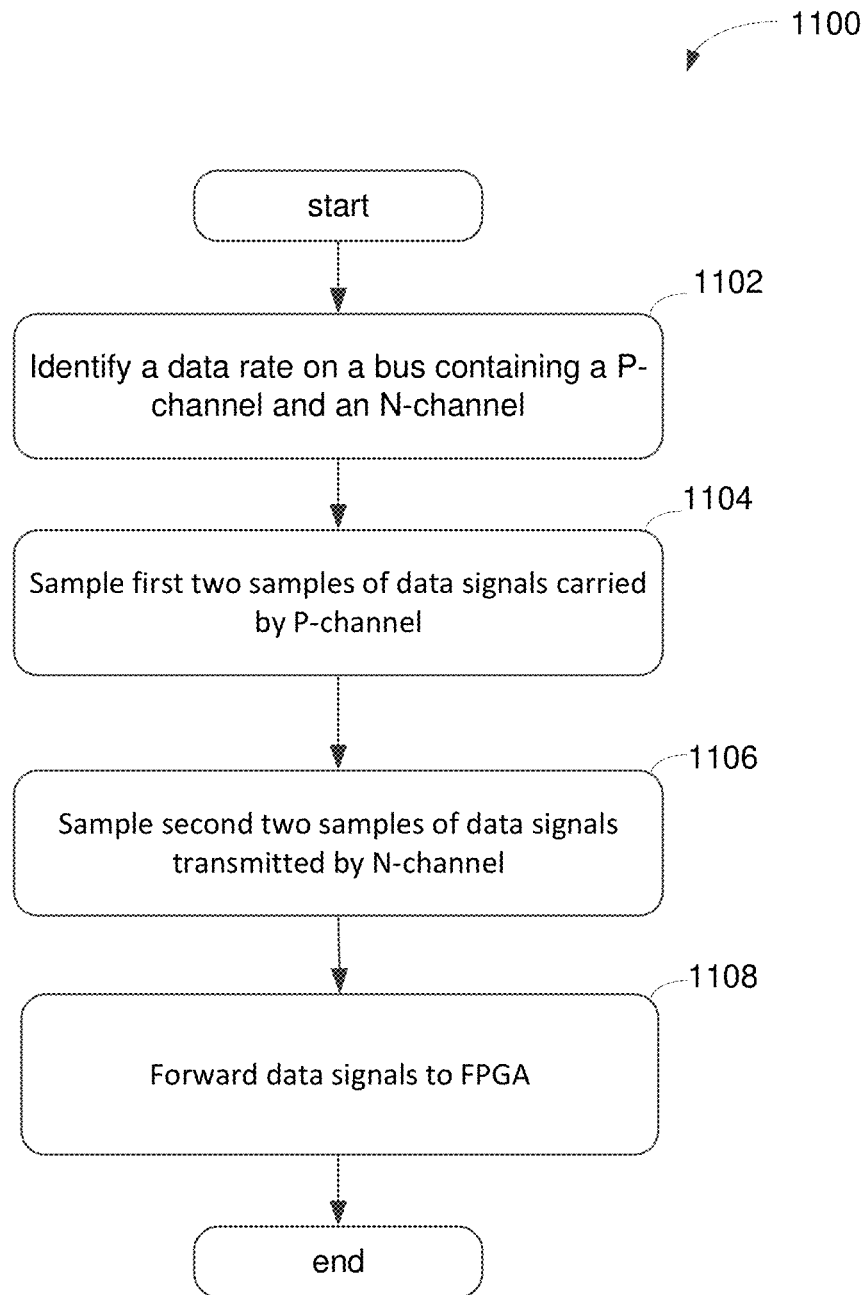
FIG. 11 is a flowchart illustrating a process of serializing and deserializing during an HS data transmission between a host and PSD or PFGA in accordance with one embodiment of the present invention.

FIG. 11 is a flowchart 1100 illustrating a process of serializing and deserializing during an HS data transmission between a host and PSD or PFGA in accordance with one embodiment of the present invention. At block 1102, a process of providing an HS data communication between a host and FPGA identifies a data rate on a bus which includes a P-channel and an N-channel operable to transmit signals in accordance with an HS USB protocol.

At block 1104, a first input deserializer oversamples the first two samples of data signals carried by the P-channel in accordance with a first clock signals clocking at the speed of twice as fast as the data rate at the P-channel.

At block 1106, a second input deserializer oversamples the second two samples of data signals transmitted by the N-channel in accordance with a second clock signal running at a speed twice as fast as the data rate at the N-channel with a ninety (90) degree phase shift.

At block 1108, the data signals are forwarded to one or more configurable LBs in FPGA. A sample decoder decodes the data signals sampled by the first and the second input deserializers to generate decoded data based on the first two samples of data signals and the second two samples of data signals. Based on the first and second two samples, a circuit of sampling adjuster adjusts clock timing for the first clock signal and/or the second clock signal to compensate bit slips due to clock drift between the host and FPGA. An NRZI decoder is able to generate data by removing bit stuff from the received data signals.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. An apparatus for network communication containing a host, a bus, and a programmable device able to perform user configurable logic functions, comprising:
    a host computer capable of facilitating high-speed ("HS") network data transmission;
    a bus coupled to the host computer for providing HS serial data transmission; and
    a programmable logic device ("PLD") coupled to the bus and configured to have,
        a drive block configured to establish a handshaking process between the host computer and the PLD via the bus for HS data transmissions;
        an IO serdes block ("ISB") coupled to the drive block and configured to facilitate serdes operation at HS data rate without employing clock synchronizing circuitry, the ISB including a first input deserializer configured to obtain first two samples of data signals on a P-channel in accordance with a first clock having a clock cycle running twice speed as data rate at the P-channel, the ISB including a second input deserializer configured to obtain second two samples of data signals on an N-channel in accordance with a second clock with a ninety (90) degree phase shift of the first clock wherein the second clock has a clock cycle running twice speed as data rate at the N-channel.

2. The apparatus of claim 1, wherein the bus includes a P-channel and an N-channel operable to transmit signals in accordance with a high-speed Universal Serial Bus ("USB") protocol.

3. The apparatus of claim 1, wherein the PLD includes a plurality of configurable logic blocks ("LBs") coupled to the first input deserializer and configured to be selectively programmed to perform one or more user defined logic functions.

4. The apparatus of claim 1, wherein the ISB includes a sample decoder coupled to the first input deserializer and configured to generate decoded data in response to the first two samples of data signals and the second two samples of data signals.

5. The apparatus of claim 4, wherein the sample decoder is able to adjust clocking times for the first clock and the second clock to compensate bit slips due to clock drift.

6. The apparatus of claim 1, wherein the ISB includes a non-return-to-zero-inverted ("NRZI") decoder coupled to the sample decoder and configured to remove bit stuff from the decoded data.

7. The apparatus of claim 1, wherein the ISB includes a first clock clocking at a range from 12 mega bit per second to 960 mega bit per second ("Mbps").

8. The apparatus of claim 7, wherein the ISB includes a second clock is clocking at 960 Mbps with a ninety (90) degree phase shift.

9. The apparatus of claim 8,
    wherein the first clock is clocking at 0 degree and 180 degree oversampling time slots; and
    wherein the second clock is clocking at a 90 degree and 270 degree oversampling time slots.

10. The apparatus of claim 1, wherein the ISB includes a transmitter coupled to an 8:1 output serializer and configured to transmit the stream of serial bits in accordance with a range of clock speed from 12 megabits per second to 480 megabits per second.

11. An apparatus containing a programmable device able to perform user configurable logic functions, the device comprising:
    a bus having a P-channel and an N-channel operable to transmit signals in accordance with a high-speed Universal Serial Bus ("USB") protocol;
    an eight-to-one ("8:1") output serializer coupled to an encoder and configured to serialize 8 bits data into a sequence of 8 bits for high-speed data transmission;
    a clock block coupled to the output 8:1 serializer and configured to provide a first clock running between 12 megahertz and 480 megahertz ("MHz") with zero (0) degree phase shift, a second clock running between 12 MHz and 480 MHz with 90 degrees phase shift; and
    a transmitter coupled to the 8:1 output serializer and configured to transmit the sequence of 8 bits in accordance with the first clock.

12. The apparatus of claim 11, further comprising a non-return-to-zero-inverted ("NRZI") encoder coupled to the bus and configured to encode eight (8) bits data obtained from one or more configurable logic blocks ("LBs").

13. The apparatus of claim 11, further comprising a first input deserializer coupled to the P-channel and configured to obtain first two samples of data signals on the P-channel in accordance with a first clock having a clock cycle running twice speed as data rate at the P-channel.

14. The apparatus of claim 11, further comprising a second input deserializer coupled to the N-channel and configured to obtain second two samples of data signals on the N-channel in accordance with a second clock with a ninety (90) degree phase shift of the first clock having a clock cycle running twice speed as data rate at the N-channel.

15. The apparatus of claim 11, further comprising a plurality of configurable logic blocks ("LBs") configured to the encoder and configured to be selectively programmed to perform one or more user defined logic functions.

16. The apparatus of claim 11, wherein a portion of the plurality of configurable LBs is configured to facilitate a termination of the P-channel.

17. The apparatus of claim 11, wherein the clock block includes a third clock running 60 Mhz.

18. A method of providing a high-speed ("HS") data communication between a host and field-programmable gate array ("FPGA") comprising:
  coupling an FPGA to a host via a bus capable of supporting HS network data transmission;
  activating a drive block of FPGA to negotiate transmission speed between the host and FPGA regarding data rate of serial data transmission over the bus;
  sampling, by a first input deserializer, first two samples of data signals carried by a P-channel in accordance with first clock cycles clocking twice as fast as the data rate at the P-channel; and
  sampling, by a second input deserializer, second two samples of data signals transmitted by an N-channel in accordance with second clock cycles running twice as fast as the data rate at the N-channel with a ninety (90) degree phase shift.

19. The method of claim 18, wherein activating a drive block of FPGA to negotiate transmission speed further comprising identifying a data rate on the bus containing a P-channel and an N-channel operable to transmit signals in accordance with a high-speed Universal Serial Bus ("USB") protocol.

20. The method of claim 18, further comprising forwarding the data signals to one or more configurable logic blocks ("LBs") in FPGA.

21. The method of claim 18, further comprising decoding, by a sample decoder, the data signals sampled by the first and the second input deserializers to generate decoded data based on the first two samples of data signals and the second two samples of data signals.

22. The method of claim 18, further comprising adjusting, by a sample decoder, clocking times for the first clock signal to compensate bit slips due to clock drift based on information obtained from the first two samples and the second two samples.

23. The method of claim 18, further comprising generating data by a non-return-to-zero-inverted ("NRZI") decoder by removing bit stuff from received data signals.

24. The method of claim 18, further comprising serializing 8 bits data into a sequence of 8 bits for a high-speed data transmission.

* * * * *